US007849237B2

(12) United States Patent
Nonomura et al.

(10) Patent No.: US 7,849,237 B2
(45) Date of Patent: Dec. 7, 2010

(54) SEMICONDUCTOR INTEGRATED CIRCUIT AND SEMICONDUCTOR DEVICE WITH THE SAME

(75) Inventors: Itaru Nonomura, Tokyo (JP); Makoto Saen, Kodaira (JP); Kenichi Osada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 211 days.

(21) Appl. No.: 12/172,512

(22) Filed: Jul. 14, 2008

(65) Prior Publication Data
US 2009/0031053 A1 Jan. 29, 2009

(30) Foreign Application Priority Data
Jul. 26, 2007 (JP) .............................. 2007-194313

(51) Int. Cl.
G06F 13/12 (2006.01)
(52) U.S. Cl. ................................ 710/62; 710/5; 326/62
(58) Field of Classification Search ....................... None
See application file for complete search history.

(56) References Cited

U.S. PATENT DOCUMENTS 5,629,838 A 5/1997 Knight et al.
6,826,191 B1 * 11/2004 Jones et al. ................. 370/401
2006/0176676 A1 * 8/2006 Kuroda et al. .............. 361/780
2006/0256964 A1 * 11/2006 Gu et al. ..................... 380/242
2007/0274198 A1 11/2007 Kuroda et al.

FOREIGN PATENT DOCUMENTS

JP 2003198356 * 7/2003
JP 2004-253816 A 9/2004
JP 2006-66454 A 3/2006

OTHER PUBLICATIONS

Alam et al., Circuit Technique for Transferring Signals through Inter-Strata Connections in 3D IC Technology, Jul. 7, 2006, IBM Technical Disclosure Bulletin, pp. 1-6.*

* cited by examiner

Primary Examiner—Eron J Sorrell
(74) Attorney, Agent, or Firm—Miles & Stockbridge P.C.

(57) ABSTRACT

An interconnect configuration technology of making an access from an IP mounted on a semiconductor chip to an IP mounted on another semiconductor chip by transmitting and receiving a packet transferred through an interconnect built in a semiconductor chip among the chips using the 3D coupling technology. The device according to the technology has an initiator for transmitting an access request, a target for receiving the access request and transmitting an access response, a router for relaying the access request and the access response, and a 3D coupling circuit (three-dimensional transceiver) for performing communication with the outside, wherein the 3D coupling circuit is disposed adjacent to the router.

15 Claims, 28 Drawing Sheets

FIG. 3

| TRANSFER ORDER | BIT [3] | BIT [2] | BIT [1] | BIT [0] |
|---|---|---|---|---|
| 1 | REQUEST VALID | ADDRESS [15] | ADDRESS [14] | ADDRESS [13] |
| 2 | ADDRESS [12] | ADDRESS [11] | ADDRESS [10] | ADDRESS [9] |
| 3 | ADDRESS [8] | ADDRESS [7] | ADDRESS [6] | ADDRESS [5] |
| 4 | ADDRESS [4] | ADDRESS [3] | ADDRESS [2] | ADDRESS [1] |
| 5 | ADDRESS [0] | COMMAND | WRITE DATA [15] | WRITE DATA [14] |
| 6 | WRITE DATA [13] | WRITE DATA [12] | WRITE DATA [11] | WRITE DATA [10] |
| 7 | WRITE DATA [9] | WRITE DATA [8] | WRITE DATA [7] | WRITE DATA [6] |
| 8 | WRITE DATA [5] | WRITE DATA [4] | WRITE DATA [3] | WRITE DATA [2] |
| 9 | WRITE DATA [1] | WRITE DATA [0] | REQUEST ID [3] | REQUEST ID [2] |
| 10 | REQUEST ID [1] | REQUEST ID [0] | '0' | '0' |

FIG. 4

| TRANSFER ORDER | BIT [3] | BIT [2] | BIT [1] | BIT [0] |
|---|---|---|---|---|
| 1 | RESPONSE VALID | STATUS | READ DATA [15] | READ DATA [14] |
| 2 | READ DATA [13] | READ DATA [12] | READ DATA [11] | READ DATA [10] |
| 3 | READ DATA [9] | READ DATA [8] | READ DATA [7] | READ DATA [6] |
| 4 | READ DATA [5] | READ DATA [4] | READ DATA [3] | READ DATA [2] |
| 5 | READ DATA [1] | READ DATA [0] | RESPONSE ID [3] | RESPONSE ID [2] |
| 6 | RESPONSE ID [1] | RESPONSE ID [0] | '0' | '0' |

FIG. 14

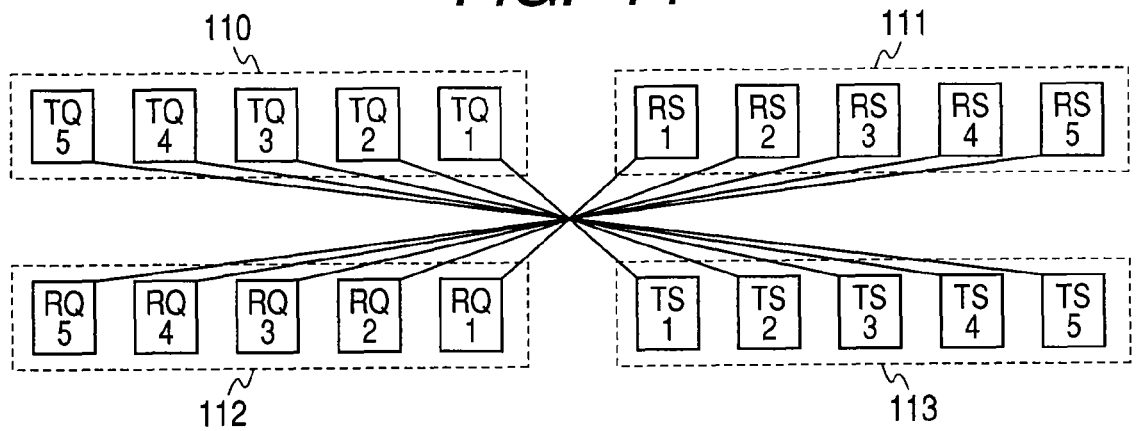

FIG. 15

| TERMINAL NAME | CORRESPONDING SIGNAL | TRANSFER METHOD |
|---|---|---|
| TQ1 | CLOCK | TRANSMISSION |
| TQ2 | BIT [3] (SERIAL REQUEST PACKET) | TRANSMISSION |
| TQ3 | BIT [2] (SERIAL REQUEST PACKET) | TRANSMISSION |
| TQ4 | BIT [1] (SERIAL REQUEST PACKET) | TRANSMISSION |
| TQ5 | BIT [0] (SERIAL REQUEST PACKET) | TRANSMISSION |

FIG. 16

| TERMINAL NAME | CORRESPONDING SIGNAL | TRANSFER METHOD |
|---|---|---|
| RS1 | CLOCK | RECEPTION |
| RS2 | BIT [3] (SERIAL RESPONSE PACKET) | RECEPTION |
| RS3 | BIT [2] (SERIAL RESPONSE PACKET) | RECEPTION |
| RS4 | BIT [1] (SERIAL RESPONSE PACKET) | RECEPTION |
| RS5 | BIT [0] (SERIAL RESPONSE PACKET) | RECEPTION |

FIG. 17

| TERMINAL NAME | CORRESPONDING SIGNAL | TRANSFER METHOD |
|---|---|---|
| RQ1 | CLOCK | RECEPTION |
| RQ2 | BIT [3] (SERIAL REQUEST PACKET) | RECEPTION |
| RQ3 | BIT [2] (SERIAL REQUEST PACKET) | RECEPTION |
| RQ4 | BIT [1] (SERIAL REQUEST PACKET) | RECEPTION |
| RQ5 | BIT [0] (SERIAL REQUEST PACKET) | RECEPTION |

FIG. 18

| TERMINAL NAME | CORRESPONDING SIGNAL | TRANSFER METHOD |
|---|---|---|
| TS1 | CLOCK | TRANSMISSION |
| TS2 | BIT [3] (SERIAL RESPONSE PACKET) | TRANSMISSION |
| TS3 | BIT [2] (SERIAL RESPONSE PACKET) | TRANSMISSION |
| TS4 | BIT [1] (SERIAL RESPONSE PACKET) | TRANSMISSION |
| TS5 | BIT [0] (SERIAL RESPONSE PACKET) | TRANSMISSION |

FIG. 33

| TERMINAL NAME | CORRESPONDING SIGNAL | CONVERSION DIRECTION | TERMINAL NAME | CORRESPONDING SIGNAL | CONVERSION DIRECTION |
|---|---|---|---|---|---|
| TQ1 | REQUEST VALID | TRANSMISSION | TQ20 | WRITE DATA [15] | TRANSMISSION |
| TQ2 | REQUEST GRANT | RECEPTION | TQ21 | WRITE DATA [14] | TRANSMISSION |
| TQ3 | ADDRESS [15] | TRANSMISSION | TQ22 | WRITE DATA [13] | TRANSMISSION |
| TQ4 | ADDRESS [14] | TRANSMISSION | TQ23 | WRITE DATA [12] | TRANSMISSION |
| TQ5 | ADDRESS [13] | TRANSMISSION | TQ24 | WRITE DATA [11] | TRANSMISSION |
| TQ6 | ADDRESS [12] | TRANSMISSION | TQ25 | WRITE DATA [10] | TRANSMISSION |
| TQ7 | ADDRESS [11] | TRANSMISSION | TQ26 | WRITE DATA [9] | TRANSMISSION |
| TQ8 | ADDRESS [10] | TRANSMISSION | TQ27 | WRITE DATA [8] | TRANSMISSION |
| TQ9 | ADDRESS [9] | TRANSMISSION | TQ28 | WRITE DATA [7] | TRANSMISSION |
| TQ10 | ADDRESS [8] | TRANSMISSION | TQ29 | WRITE DATA [6] | TRANSMISSION |
| TQ11 | ADDRESS [7] | TRANSMISSION | TQ30 | WRITE DATA [5] | TRANSMISSION |
| TQ12 | ADDRESS [6] | TRANSMISSION | TQ31 | WRITE DATA [4] | TRANSMISSION |
| TQ13 | ADDRESS [5] | TRANSMISSION | TQ32 | WRITE DATA [3] | TRANSMISSION |
| TQ14 | ADDRESS [4] | TRANSMISSION | TQ33 | WRITE DATA [2] | TRANSMISSION |
| TQ15 | ADDRESS [3] | TRANSMISSION | TQ34 | WRITE DATA [1] | TRANSMISSION |
| TQ16 | ADDRESS [2] | TRANSMISSION | TQ35 | WRITE DATA [0] | TRANSMISSION |
| TQ17 | ADDRESS [1] | TRANSMISSION | TQ36 | REQUEST ID [3] | TRANSMISSION |
| TQ18 | ADDRESS [0] | TRANSMISSION | TQ37 | REQUEST ID [2] | TRANSMISSION |
| TQ19 | COMMAND | TRANSMISSION | TQ38 | REQUEST ID [1] | TRANSMISSION |
|  |  |  | TQ39 | REQUEST ID [0] | TRANSMISSION |

FIG. 34

| TERMINAL NAME | CORRESPONDING SIGNAL | CONVERSION DIRECTION | TERMINAL NAME | CORRESPONDING SIGNAL | CONVERSION DIRECTION |
|---|---|---|---|---|---|
| RQ1 | REQUEST VALID | RECEPTION | RQ20 | WRITE DATA [15] | RECEPTION |
| RQ2 | REQUEST GRANT | TRANSMISSION | RQ21 | WRITE DATA [14] | RECEPTION |
| RQ3 | ADDRESS [15] | RECEPTION | RQ22 | WRITE DATA [13] | RECEPTION |
| RQ4 | ADDRESS [14] | RECEPTION | RQ23 | WRITE DATA [12] | RECEPTION |
| RQ5 | ADDRESS [13] | RECEPTION | RQ24 | WRITE DATA [11] | RECEPTION |
| RQ6 | ADDRESS [12] | RECEPTION | RQ25 | WRITE DATA [10] | RECEPTION |
| RQ7 | ADDRESS [11] | RECEPTION | RQ26 | WRITE DATA [9] | RECEPTION |
| RQ8 | ADDRESS [10] | RECEPTION | RQ27 | WRITE DATA [8] | RECEPTION |
| RQ9 | ADDRESS [9] | RECEPTION | RQ28 | WRITE DATA [7] | RECEPTION |
| RQ10 | ADDRESS [8] | RECEPTION | RQ29 | WRITE DATA [6] | RECEPTION |
| RQ11 | ADDRESS [7] | RECEPTION | RQ30 | WRITE DATA [5] | RECEPTION |
| RQ12 | ADDRESS [6] | RECEPTION | RQ31 | WRITE DATA [4] | RECEPTION |
| RQ13 | ADDRESS [5] | RECEPTION | RQ32 | WRITE DATA [3] | RECEPTION |
| RQ14 | ADDRESS [4] | RECEPTION | RQ33 | WRITE DATA [2] | RECEPTION |
| RQ15 | ADDRESS [3] | RECEPTION | RQ34 | WRITE DATA [1] | RECEPTION |
| RQ16 | ADDRESS [2] | RECEPTION | RQ35 | WRITE DATA [0] | RECEPTION |
| RQ17 | ADDRESS [1] | RECEPTION | RQ36 | REQUEST ID [3] | RECEPTION |
| RQ18 | ADDRESS [0] | RECEPTION | RQ37 | REQUEST ID [2] | RECEPTION |
| RQ19 | COMMAND | RECEPTION | RQ38 | REQUEST ID [1] | RECEPTION |
| | | | RQ39 | REQUEST ID [0] | RECEPTION |

FIG. 35

| TERMINAL NAME | CORRESPONDING SIGNAL | CONVERSION DIRECTION |
|---|---|---|
| TS1 | RESPONSE VALID | TRANSMISSION |
| TS2 | RESPONSE GRANT | RECEPTION |
| TS3 | STATUS | TRANSMISSION |
| TS4 | READ DATA [15] | TRANSMISSION |
| TS5 | READ DATA [14] | TRANSMISSION |
| TS6 | READ DATA [13] | TRANSMISSION |
| TS7 | READ DATA [12] | TRANSMISSION |
| TS8 | READ DATA [11] | TRANSMISSION |
| TS9 | READ DATA [10] | TRANSMISSION |
| TS10 | READ DATA [9] | TRANSMISSION |
| TS11 | READ DATA [8] | TRANSMISSION |
| TS12 | READ DATA [7] | TRANSMISSION |
| TS13 | READ DATA [6] | TRANSMISSION |
| TS14 | READ DATA [5] | TRANSMISSION |
| TS15 | READ DATA [4] | TRANSMISSION |
| TS16 | READ DATA [3] | TRANSMISSION |
| TS17 | READ DATA [2] | TRANSMISSION |
| TS18 | READ DATA [1] | TRANSMISSION |
| TS19 | READ DATA [0] | TRANSMISSION |
| TS20 | RESPONSE ID [3] | TRANSMISSION |
| TS21 | RESPONSE ID [2] | TRANSMISSION |
| TS22 | RESPONSE ID [1] | TRANSMISSION |
| TS23 | RESPONSE ID [0] | TRANSMISSION |

FIG. 36

| TERMINAL NAME | CORRESPONDING SIGNAL | CONVERSION DIRECTION |
|---|---|---|
| RS1 | RESPONSE VALID | RECEPTION |
| RS2 | RESPONSE GRANT | TRANSMISSION |
| RS3 | STATUS | RECEPTION |
| RS4 | READ DATA [15] | RECEPTION |
| RS5 | READ DATA [14] | RECEPTION |
| RS6 | READ DATA [13] | RECEPTION |
| RS7 | READ DATA [12] | RECEPTION |
| RS8 | READ DATA [11] | RECEPTION |
| RS9 | READ DATA [10] | RECEPTION |
| RS10 | READ DATA [9] | RECEPTION |
| RS11 | READ DATA [8] | RECEPTION |
| RS12 | READ DATA [7] | RECEPTION |
| RS13 | READ DATA [6] | RECEPTION |
| RS14 | READ DATA [5] | RECEPTION |
| RS15 | READ DATA [4] | RECEPTION |
| RS16 | READ DATA [3] | RECEPTION |
| RS17 | READ DATA [2] | RECEPTION |
| RS18 | READ DATA [1] | RECEPTION |
| RS19 | READ DATA [0] | RECEPTION |
| RS20 | RESPONSE ID [3] | RECEPTION |
| RS21 | RESPONSE ID [2] | RECEPTION |
| RS22 | RESPONSE ID [1] | RECEPTION |
| RS23 | RESPONSE ID [0] | RECEPTION |

SEMICONDUCTOR INTEGRATED CIRCUIT AND SEMICONDUCTOR DEVICE WITH THE SAME

CLAIM OF PRIORITY

The patent application claims priority from Japanese patent application JP 2007-194313 filed on Jul. 26, 2007.

FIELD OF THE INVENTION

The present invention relates to a semiconductor integrated circuit and a semiconductor device (SiP etc.) that is formed with a plurality of semiconductor circuits sealed in a package.

BACKGROUND OF THE INVENTION

As a technology that the present inventors examined, the following technology is conceivable in a semiconductor device, for example, a SiP (System in Package) and the like.

In connection with minuteness of semiconductor manufacturing technologies, insufficiency of I/O performance of the semiconductor chip is becoming aggravated. This is because of the following circumstances. Since the improved minuteness allows the circuit mounted in a semiconductor chip to increase in number, the quantity of I/O processing (the number of I/O's, their speed, etc.) necessary for the semiconductor chip to realize functions increases. On the other hand, since the number of terminals of the semiconductor chip is limited by wire bonding etc. and is governed by a chip size, i.e., it does not increase by the minuteness, I/O processing performance is not improved.

In these circumstances, in order to solve the insufficiency of I/O performance of the semiconductor chip, there is actively developed a three-dimensional (3D) coupling technology in which terminals are disposed on the top face and down face of the semiconductor chip two-dimensionally and a plurality of semiconductor chips are stacked, whereby information is transferred among the stacked chips.

For this reason, in the case where the SiP is formed by stacking the semiconductor chips on which the 3D coupling technology is mounted, 3D coupling and a conventionally existing interconnect network inside the semiconductor chip need to be coupled.

For example, as one example of the technology of performing data communication among the chips by the 3D coupling technology of an inductive coupling method, there can be enumerated a technology described in JP-A-2006-066454.

Moreover, as one example of the technology of performing data communication among the chips by the 3D coupling technology of a capacitive coupling method, there can be enumerated a technology described in JP-A-2004-253816.

SUMMARY OF THE INVENTION

On the other hand, as a result of this inventors' examining the technology of the above-mentioned semiconductor device, the following has become clear.

For example, each of JP-A-2006-066454 and JP-A-2004-253816 discloses that the 3D coupling technology enables a semiconductor device to perform communication between the interior of the semiconductor chip and the exterior of the semiconductor chip with a low latency (delay) and with a high throughput while consuming a smaller amount of power.

However, the above-mentioned technology does not refer to the coupling between the on-chip interconnect existing inside the semiconductor chip and the 3D coupling technology.

Then, one object of the present invention is, in a semiconductor integrated circuit and a semiconductor device, to provide an interconnect construction technology that performs an access from an IP (Intellectual Property) mounted on a semiconductor chip to an IP mounted on another semiconductor chip effectively by transmitting/receiving a packet transferred trough an interconnect built in the semiconductor chip using the 3D coupling technology.

Moreover, another object of this invention is, in the semiconductor integrated circuit and the semiconductor device, to provide a technology that can realize synchronous transfer between the semiconductor chips by constructing a clock tree with a smaller skew to a plurality of semiconductor chips, and decrease a latency in transfer between the semiconductor chips using the 3D coupling technology.

These and other objects and new features of the present invention will become apparent by reference to the following description and their attached drawings of this patent application.

If an outline of the representative aspect of the patent among those disclosed in this patent application is explained briefly, it will be as follows.

That is, each of the semiconductor integrated circuit and the semiconductor device according to the present invention is one that has an initiator for transmitting an access request, a target for receiving the access request and transmitting an access response, a router for relaying the access request and the access response, and a 3D coupling circuit for performing communication with the outside, wherein the 3D coupling circuit is disposed adjacent to the router.

Moreover, alternatively, each of the semiconductor integrated circuit and the semiconductor device is one that has an initiator for transmitting the access request, a target for receiving the access request and transmitting the access response, a router for relaying the access request and the access response, the 3D coupling circuit for performing communication with the outside, a serializer that serializes the access request and the access response that the router transmitted and supplies them to the 3D coupling circuit, and a parallelizer that parallelizes the access request and the access response that the 3D coupling circuit transmitted and supplies them to the 3D coupling circuit, wherein the serializer and the parallelizer are disposed adjacent to the router and the 3D coupling circuit.

Moreover, alternatively, each of the semiconductor integrated circuit and the semiconductor device is one that has an initiator for transmitting the access request, a target for receiving the access request and transmitting the access response, a local router for relaying the access request and the access response, a global router for relaying the access request and the access response that the local router transmits/receives, and the 3D coupling circuit for performing communication with the outside, wherein the 3D coupling circuit is disposed adjacent to the local router.

Moreover, alternatively, each of the semiconductor integrated circuit and the semiconductor device is one that has an initiator for transmitting the access request, a target for receiving the access request and transmitting the access response, a local router for relaying the access request and the access response, a DMA controller for transmitting the access request and performing a memory copy operation, a global router for relaying the access request and the access account between the local router, and the 3D coupling circuit for performing communication with the outside, wherein the DMA controller and the 3D coupling circuit are disposed adjacent to the local router.

If an effect that can be attained by the representative aspect of the invention among those disclosed in this patent application is explained briefly, it will be as follows.

One aspect of the invention enables different LSI's (semiconductor integrated circuits) to be connected with each other in a shortest distance, and enables the different LSI's to perform large capacity communication with low electric power.

BRIEF DESCRIPTION OF THE DRAWINGS

FIG. 3 is a diagram showing a format of a serial request packet according to the first embodiment of the present invention;

FIG. 4 is a diagram showing a format of a serial response packet according to the first embodiment of the present invention;

FIG. 14 is a diagram showing positions of transmission and reception terminals (coil) included in the 3D transceiver A according to the first embodiment of the present invention;

FIG. 15 is a relation diagram showing relations among transmission coils TQ1 to TQ5 and transmission signals of the serial request packets and the clock included in the request transmitter circuit A according to the first embodiment of the present invention;

FIG. 16 is a relation diagram showing relations among reception coils RS1 to RS5 and transmission signals of the serial response packets and the clock included in the response receiver circuit A according to the first embodiment of the present invention;

FIG. 17 is a relation diagram showing relations among reception coils RQ1 to RQ5 and transmission signals of the serial request packets and the clock included in a request receiver circuit A according to the first embodiment of the present invention;

FIG. 18 is a relation diagram showing relations among transmission coils TS1 to TS5 and transmission signals of serial response packets and the clock included in a response transmitter circuit A according to the first embodiment of the present invention;

FIG. 33 is a diagram showing correspondence between terminals TQ1 to TQ39 and signal names according to the second embodiment of the present invention;

FIG. 34 is a diagram showing correspondence between terminals RQ1 to RQ39 and signal names according to the second embodiment of the present invention;

FIG. 35 is a diagram showing correspondence between terminals TS1 to TS23 and signal names according to the second embodiment of the present invention;

FIG. 36 is a diagram showing correspondence between terminals RS1 to RS23 and signal names according to the second embodiment of the present invention;

DETAILED DESCRIPTION OF THE PREFERRED EMBODIMENTS

Figure 1:
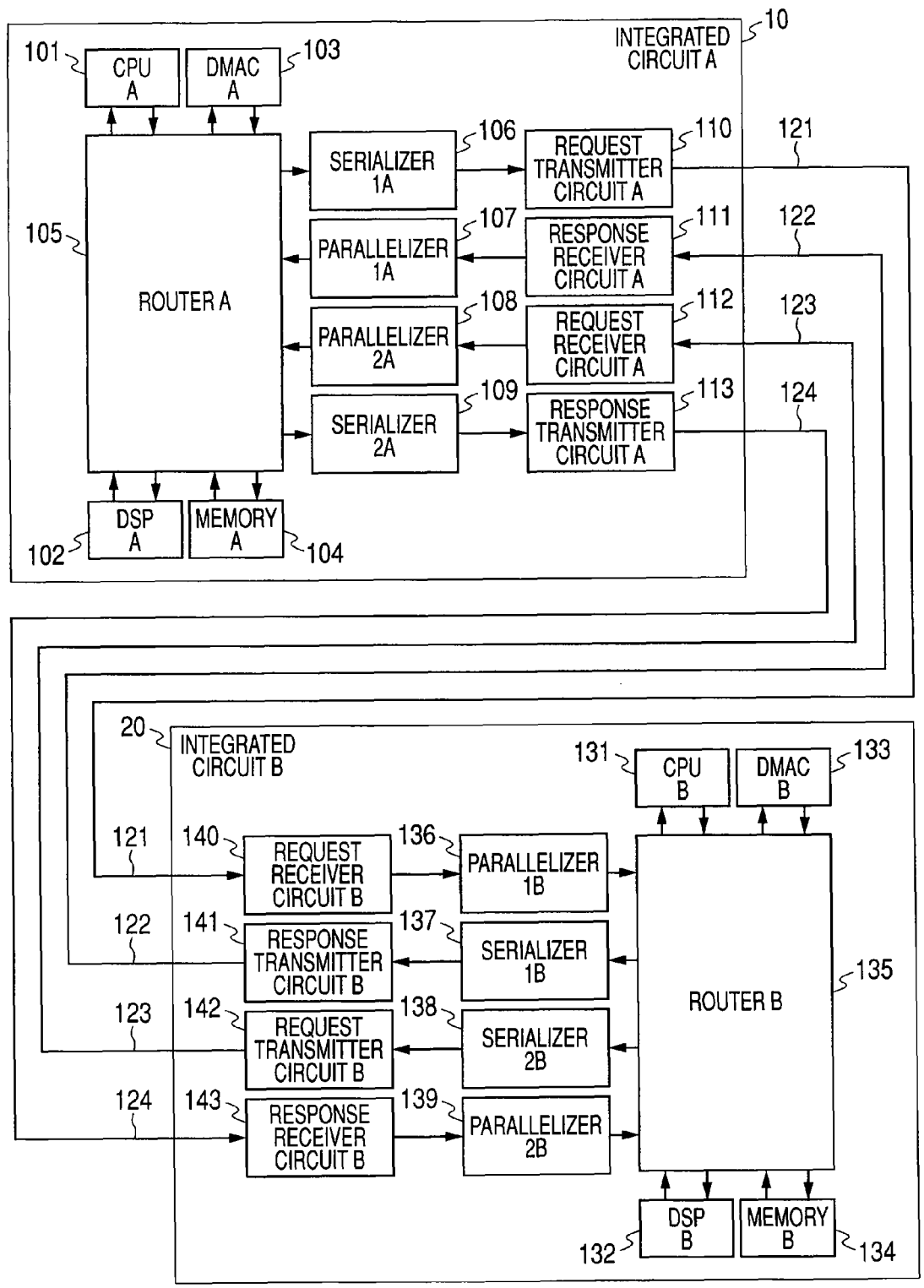
FIG. 1 is a block diagram showing a configuration of two semiconductor integrated circuits and their connection form according to a first embodiment of the present invention.

Hereafter, embodiments of the present invention will be described in detail with reference to drawings. Incidentally, in all the figures for explaining the embodiments, as a principle, the same member is designated with the same reference numeral and its repeated explanation is omitted.

First Embodiment

In this first embodiment, two semiconductor integrated circuits that are housed in a single package and are coupled by 3D coupling will be described.

FIG. 1 is a block diagram showing a configuration of the two semiconductor integrated circuits in the first embodiment and their connection form.

In this first embodiment, a case will be explained where the two semiconductor integrated circuits that have the same function and adopt the same configuration are connected with each other to configure a circuit whose throughput is doubled compared to a case where each semiconductor integrated circuit is used alone.

First, with FIG. 1, configurations of a semiconductor integrated circuit (hereinafter, also referred to simply as an "integrated circuit") and of a semiconductor device will be explained.

An integrated circuit A 10 is constructed by including a CPU A 101, a DSP A 102, a DMAC A 103, memory A 104, a router A 105, a serializer 1A 106, a parallelizer 1A 107, a parallelizer 2A 108, a serializer 2A 109, a request transmitter circuit A 110, a response receiver circuit A 111, a request receiver circuit A 112, and a response transmitter circuit A 113.

An integrated circuit B 20 is constructed by including a CPU B 131, a DSP B 132, a DMAC B 133, memory B 134, a router B 135, a parallelizer 1B 136, a serializer 1B 137, a serializer 2B 138, a parallelizer 2B 139, a request receiver circuit B 140, a response transmitter circuit B 141, a request transmitter circuit B 142, and a response receiver circuit B 143.

Request transmission coupling AB121 is inductive coupling that couples the request transmitter circuit A 110 and the request receiver circuit B 140.

Response reception coupling BA122 is inductive coupling that couples the response receiver circuit A 111 and the response transmitter circuit B 141.

Request reception coupling BA123 is inductive coupling that couples the request receiver circuit A 112 and the request transmitter circuit B 142.

Response transmission coupling AB124 is inductive coupling that couples the response transmitter circuit A 113 and the response receiver circuit B 143.

The CPU A 101 is a processor that controls the integrated circuit A 10 and the integrated circuit B 20 by accessing the memory A 104 through the router A 105 and executing a program currently held in the memory. Any access in the integrated circuit A 10 is performed by a split protocol in which a module requiring an access transmits a request packet including an access request and a module having received the access request transmits a response packet including an access response to the module having required the access, as a final step. Incidentally, in this specification, the module that requires an access is called an initiator and the module that responds to the access is called a target.

The request packet and the response packet that are transferred among the router A 105, the CPU A 101, the DSP A 102, the DMAC A 103, the memory A 104, the serializer 1A 106, the parallelizer 1A 107, the parallelizer 2A 108, and the serializer 2A 109 as well as signals used for transmitting/receiving the request packet and the response packet will be explained with reference to drawings. The serializer and the parallelizer here referred to designate functional circuits for converting a communication format including a data width.

Figure 2:
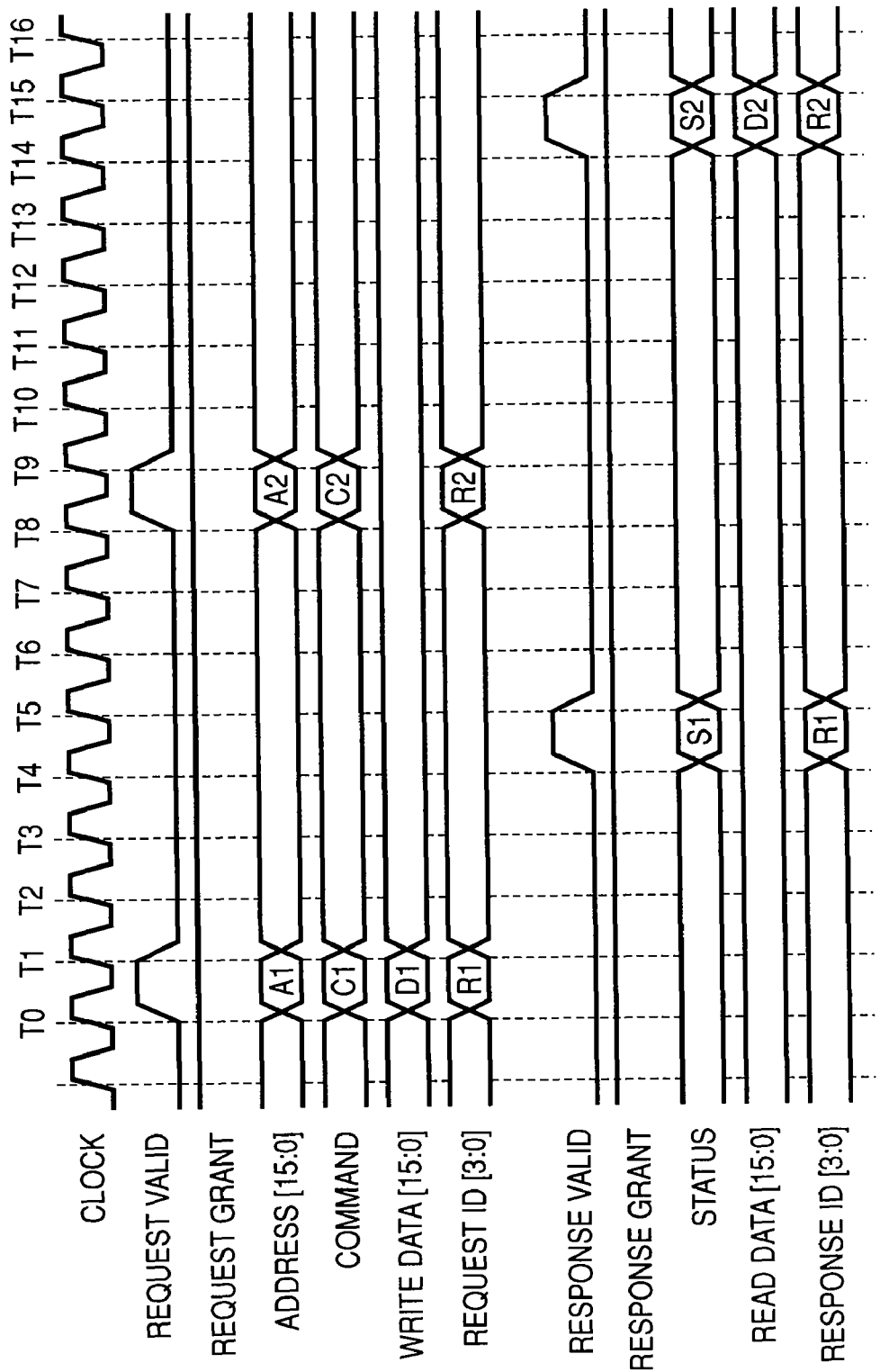
FIG. 2 is a timing chart of a split protocol according to the first embodiment of the present invention.

FIG. 2 is a timing chart in the case of performing a write access and a read access each once, respectively, using the split protocol in this first embodiment.

In the write access in FIG. 2, the initiator outputs the address "A1," the command "C1," the write data "D1," and the request ID "R1" that are the contents of the access request at time T1, and informs the target of the contents of the access request being outputted by setting a request valid signal indicating that the contents of the access request are being outputted at a HIGH level. The request ID is identification information for identifying the initiator, when the router relays the response packet from the target to the initiator. The target outputs a request ID of the corresponding request packet as a response ID of the response packet, when transmitting the response packet.

Below, in this specification, that a circuit outputting a one-bit control signal, such as the request valid signal, changes the signal to a value indicating that the control signal is in a significant state is expressed as "to assert," and that it changes the signal to a value indicating that the control signal is not significant is expressed as "to deassert." Moreover, that a one-bit control signal has a value indicating being significant is expressed as an "assert state"; that the binary control signal has a value indicating not being significant is expressed as a "deassert state." In this specification, an address, a command, and write data, and a request valid that are the contents of the access request are called the request packet; a status, read data, and a response valid that are the contents of the access response are called the response packet.

When the target can receive the request packet, the target asserts a request grant that indicates being capable of reception of the request packet. At a rising edge of the clock, when both the request valid and the request grant are in the assert state, the request packet is transferred to the target from the initiator. In FIG. 2, the target executes the write access by detecting that the request valid signal is in the assert state at time T1, grabbing the address, the command, the write data, and the request ID that are the contents of the access request, and writing a value "D1" in an address area indicated as address "A1." Then, the target asserts a response valid signal indicating that the access response information is effective at time T5, and transmits a status "S1" indicating whether the write access was normally executed and a response ID "R1," as the access response, to the initiator. When the initiator can receive the response packet, the initiator asserts the response grant signal and notifies being capable of receiving the response packet to the target. In the rising edge of the clock, when both the response valid and the response grant are in the assert state, the response packet is transferred to the initiator from the target.

Next, the read access will be explained.

In the read access in FIG. 2, the initiator outputs an address "A2," a command "C2," and a request ID "R2" that are the contents of the access request at time T9, and asserts the request valid signal.

The target detects that the request valid signal is in the assert state at time T9, grabs the address, the command, and the request ID that are the contents of the access request, and reads a value "D2" from an address area designated by the address "A2." Then, the target asserts the response valid signal indicating that the access response information is valid, and transmits a status "S2" indicating whether the read access is normally executed, the read data "D2," and the response ID "R2" as the access response to the initiator.

Explanation will return to the module included in the integrated circuit A 10.

The DSP A 102 is a DSP (Digital Signal Processor) that accesses the memory A 104 through the router A 105, performs calculation by executing a program currently held in the memory, and stores the calculated result in the memory A 104.

The DMAC A 103 is a DMAC (Direct Memory Access Controller) that accesses the memory A 104 and the memory B 134 through the router A 105, and copies data between the memory A 104 and the memory B 134.

The memory A 104 is a storage device that receives the request packet from the router A 105, generates the response packet based on the request packet, and transmits the response packet to the router A 105.

The router A 105 is a relay circuit for relaying the request packet and the response packet that the CPU A 101, the DSP A 102, the DMAC A 103, the memory A 104, the serializer 1A 106, the parallelizer 1A 107, the parallelizer 2A 108, and the serializer 2A 109 transmit and receive.

Next, the serializer 1A 106 will be explained.

The serializer 1A 106 is a conversion circuit that generates a serialized request packet by serializing the request packet received from the router A 105, and transmits the serialized request packet to the request transmitter circuit A 110. Below, in this specification, the request packet that is serialized is called a serial request packet. Here, the serialization means not only converting data whose width is a plurality of bits into data of one-bit width but also thinning the bit width of the data in the wide sense.

Next, a format of the serial request packet will be explained with reference to a drawing.

FIG. 3 is a diagram showing the format of the serial request packet.

The serial request packet is generated by extracting the request valid, the address, the command, the write data, and the request ID from the request packet that was explained previously, and arranging sets of four bits starting from bit 3 that is a MSB (Most Significant Bit) sequentially. The serial request packet is transferred starting from the four bits that includes the request valid sequentially. The number of cycles required to transfer the serial request packet is 10 cycles. Bit 1 to bit 0 of the serial request packet transferred at the tenth cycle are "00."

Next, the parallelizer 1A 107 will be explained. The parallelizer 1A 107 is a conversion circuit that receives a serialized response packet from the response receiver circuit A 111, converts the serialized response packet into the response packet, and transmits the response packet to the router A 105. Below, in this specification, the serialized response packet is called a serial response packet.

Here, a format of the serial response packet will be explained with reference to a drawing.

FIG. 4 is a diagram showing a format of the serial response packet.

The serial response packet is generated by extracting a response valid, a status, read data, and a response ID from the response packet explained previously, and arranging every set of four bits starting from bit 3 that is a MSB (Most Significant Bit) sequentially. The serial response packet is transferred starting from four bits that includes the response valid sequentially. The number of cycles that are required to transfer the serial response packet is six cycles. Bit 1 to bit 0 of the serial response packet transferred at sixth cycle is "00."

The parallelizer 2A 108 is a conversion circuit that receives the serial request packet from the request receiver circuit A 112, converts the serial request packet into the request packet, and transmits the request packet to the router A 105.

The serializer 2A 109 is a conversion circuit that receives the response packet from the router A 105, converts the response packet into the serial response packet, and transmits the serial response packet to the response transmitter circuit A 113.

Next, the request transmitter circuit A 110 will be explained with reference to a drawing.

Figure 5:
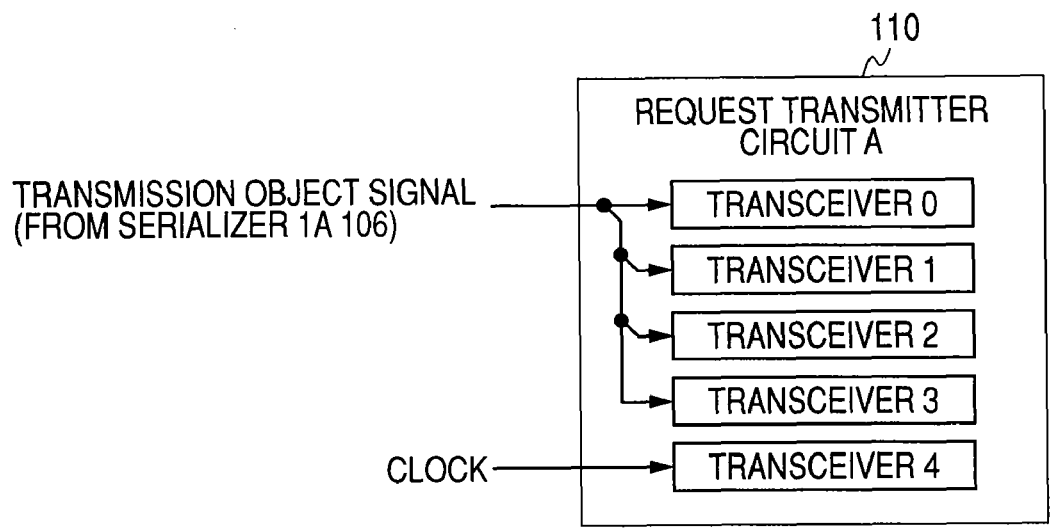
FIG. 5 is a block diagram showing a configuration of a request transmitter circuit A according to the first embodiment of the present invention.
Figure 6:
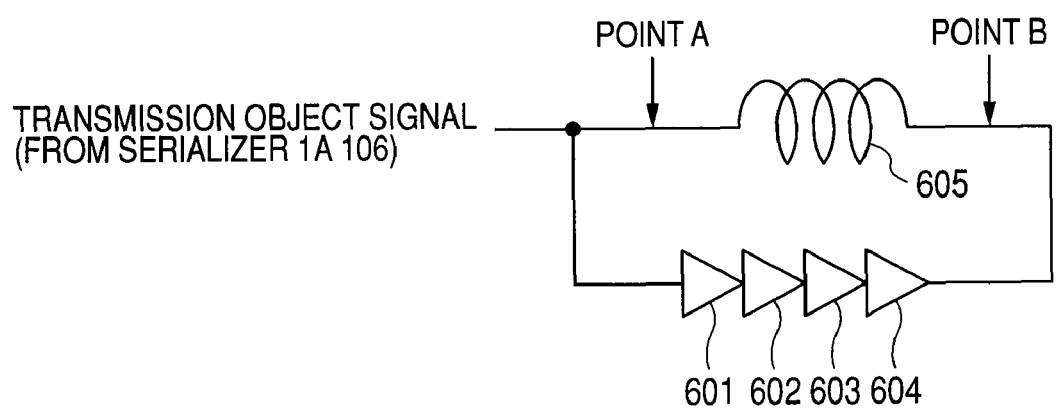
FIG. 6 is a circuit diagram of a transceiver included in the request transmitter circuit A according to the first embodiment of the present invention.
Figure 7:
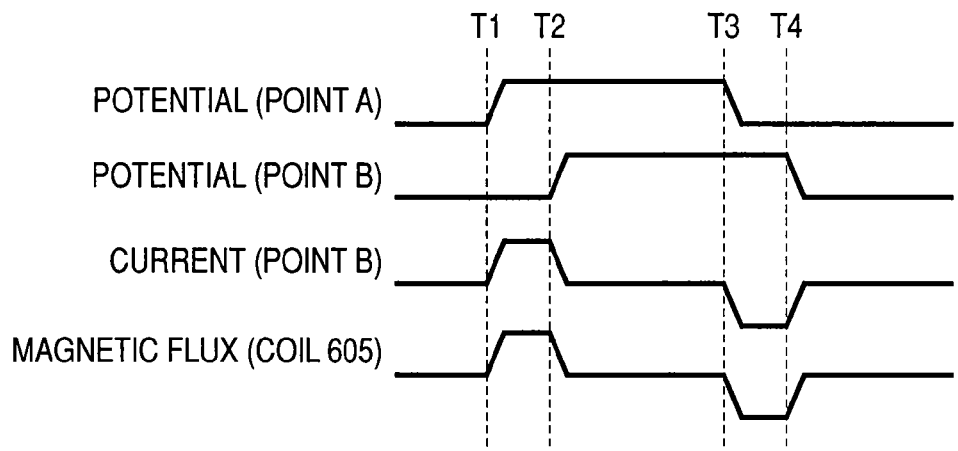
FIG. 7 is a timing chart for showing operations of the transceiver included in the request transmitter circuit A according to the first embodiment of the present invention.

FIG. 5 is a block diagram showing a configuration of the request transmitter circuit A 110; FIG. 6 is a circuit diagram of a transceiver included in the request transmitter circuit A 110; FIG. 7 is a timing chart showing operations of the transceiver included in the request transmitter circuit A 110.

The request transmitter circuit A 110 has five internal transceivers. Four transceivers among them are used for transmitting the serial request packets, and the remaining one is used for transmitting the clock. The four transceivers are connected to signals supplied from the serializer 1A 106, respectively, and the remaining one transceiver is given the generated clock. Each transceiver is constructed with buffers 601 to 604 and a coil 605.

Next, operations of the transceiver will be explained using FIG. 6. The transceiver converts a change of the potential of the supplied electric signal into a change of magnetic flux.

A potential of a point A in FIG. 6 is a potential of the signal supplied, and a potential of a point B varies to the potential of the point A behind it due to a delay of the buffers 601 to 604.

For this reason, representing a current direction at the point B in which it flows from the point A to the point B as a positive direction, when the potential of the point A changes from a LOW level to the HIGH level due to delay of the buffers 601 to 604, the current becomes positive only in a period of the delay time of the buffers 601 to 604; when the potential of the point A changed from the HIGH level to the LOW level, the current becomes negative only in the period of the delay time of the buffers 601 to 604.

Since a magnetic flux proportional to the current at the point B is generated in the coil 605, when the signal at the point A changes from the LOW level to the HIGH level, the magnetic flux in the positive direction is generated only in the period of the delay time of the buffers 601 to 604; when the signal at the point A changes from the HIGH level to the LOW level, the magnetic flux in the negative direction is generated only in the period of the delay time of the buffers 601 to 604.

Next, the response receiver circuit A 111 will be explained with reference to a drawing.

Figure 8:
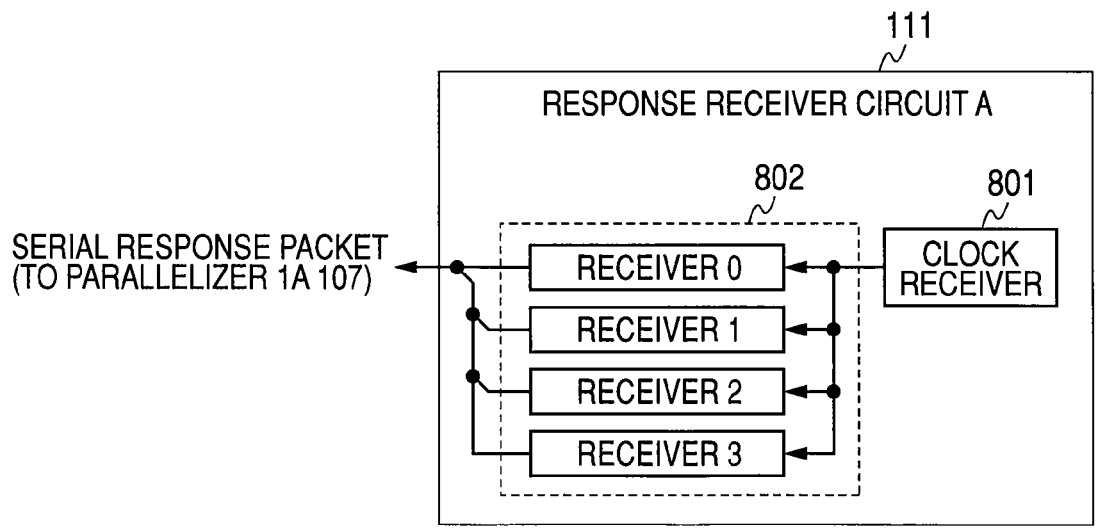
FIG. 8 is a block diagram showing a configuration of a response receiver circuit A according to the first embodiment of the present invention.
Figure 9:
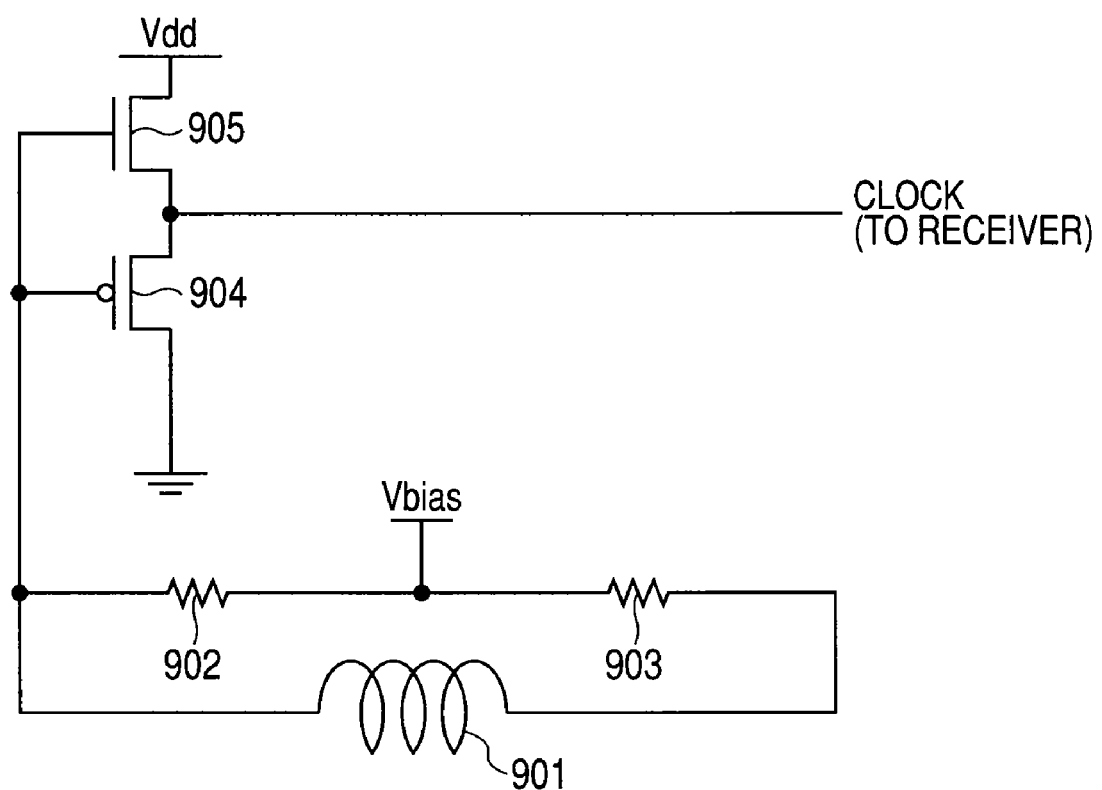
FIG. 9 is a circuit diagram showing a circuit configuration of a clock receiver included in the response receiver circuit A according to the first embodiment of the present invention.
Figure 10:
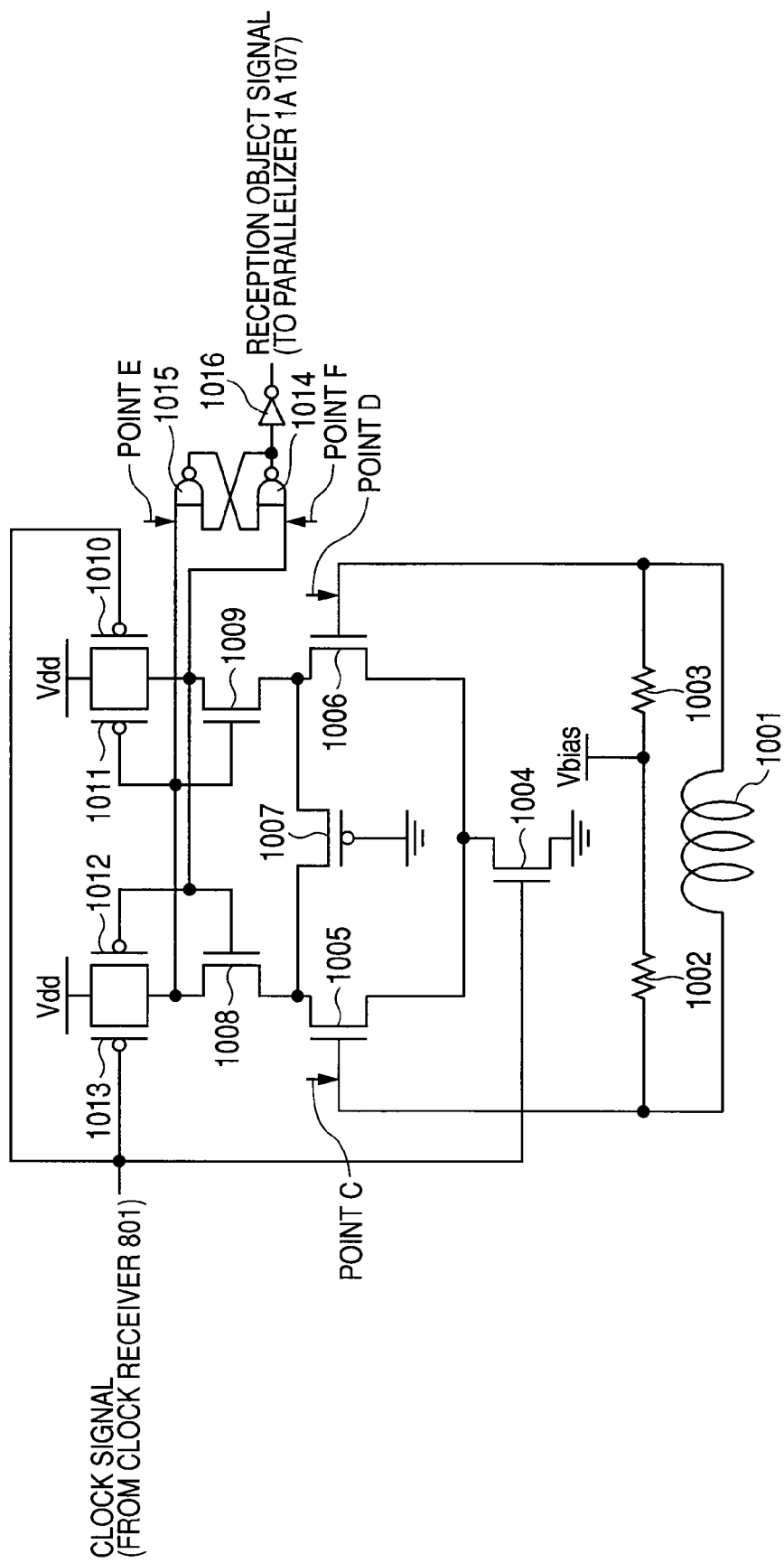
FIG. 10 is a circuit diagram of a receiver included in the response receiver circuit A according to the first embodiment of the present invention.
Figure 11:
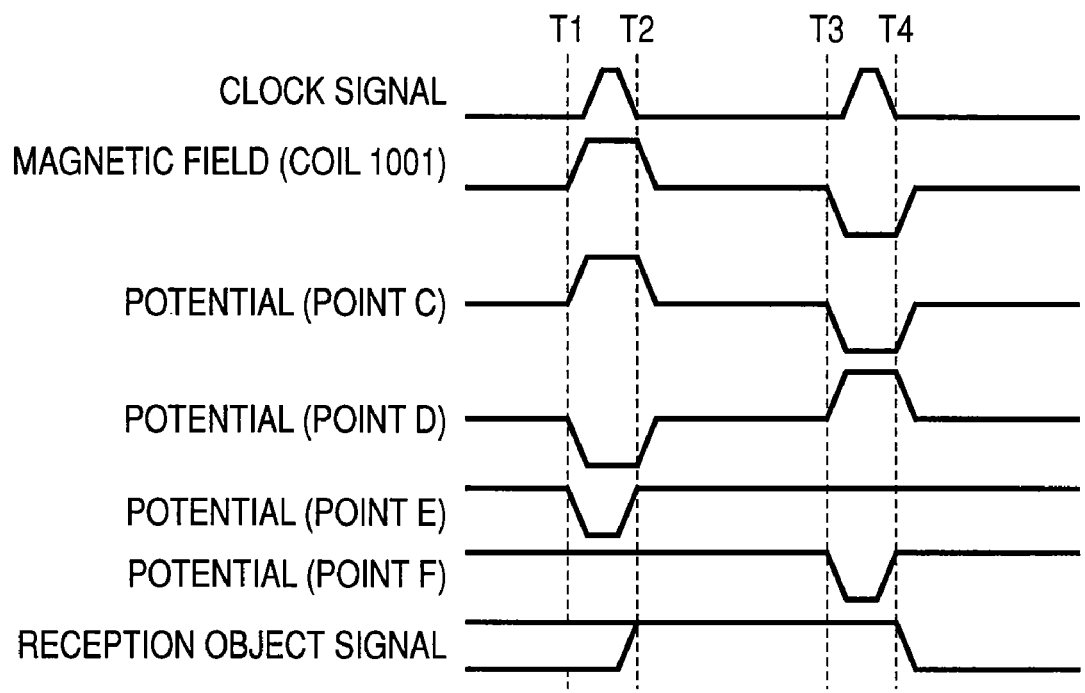
FIG. 11 is a timing chart showing operations of the receiver included in the response receiver circuit A according to the first embodiment of the present invention.

FIG. 8 is a block diagram showing a configuration of the response receiver circuit A 111. FIG. 9 is a circuit diagram of the clock receiver included in the response receiver circuit A 111; FIG. 10 is a circuit diagram of the receiver included in the response receiver circuit A 111; FIG. 11 is a timing chart showing operations of the receiver included in the response receiver circuit A 111.

The response receiver circuit A 111 includes a clock receiver 801 and a receiver group 802 consisting of four receivers. An output terminal of the each receiver is connected to a serial response packet input terminal of the parallelizer 1A 107 and a clock input terminal of the parallelizer 1A 107, respectively.

The clock receiver 801 will be explained with reference to a drawing. FIG. 9 is a circuit diagram showing a circuit configuration of the clock receiver.

The clock receiver 801 is constructed with a coil 901, resistances 902, 903, and transistors 904, 905.

The coil 901 generates a potential difference according to a rate of change of magnetic flux. In this first embodiment, the coil 901 is connected with the gate terminals of the transistors 904, 905 so that, when the magnetic flux becomes strong, the transistors 904, 905 may be ON state, respectively. For this reason, when the magnetic flux imposing on the coil 901 becomes strong, the clock receiver 801 outputs a signal of the HIGH level. In this figure, Vbias is a fixed value, such as Vdd/2.

Next, the receiver included in the response receiver circuit A 111 will be explained. The receiver is constructed with a coil 1001, resistances 1002, 1003, transistors 1004 to 1013, NAND circuits 1014, 1015, and an inverter 1016.

The receiver is a circuit that detects a change of the magnetic flux at the rising edge of the clock signal, converts the change into a reception object signal, and holds the level of the reception object signal until the next clock edge comes Below, operations of the receiver will be explained.

The coil 1001 generates a potential difference according to the rate of change of magnetic flux. In this first embodiment, when the magnetic flux imposing on the coil 1001 becomes strong, the potential of the point C becomes higher than the potential of the point D, which brings a transistor 1005 into the ON state. When the magnetic flux imposing on the coil 1001 becomes weaker, the potential of the point D becomes higher than the potential of the point C, which brings a transistor 1006 to the ON state.

When the clock signal is at the LOW level, the transistors 1010 and 1013 are ON state, and the potentials of the point E and the point F located on the drain side of the two transistors are at the HIGH level, respectively. For this reason, the output levels of the NAND circuits 1014, 1015 are held, and the potential of the reception object signal, i.e., signal level, does not change. Moreover, since the potentials of the point E and the point F are HIGH, the transistors 1008, 1009 are ON state, and the source potentials of the transistors 1005, 1006 are at the HIGH level.

When the clock signal is at the HIGH level, the transistor 1004 becomes ON state and the drain potential of the transistors 1005, 1006 become LOW. On the other hand, the transistors 1010 to 1013 are OFF state.

At this time, if the coil 1001 generates a potential difference by a change of the magnetic flux and makes the transistor 1005 be ON state, the source potential (a potential of the point E) of the transistor 1008 becomes LOW because the drain potential of the transistor 1005 is at the LOW level and the transistors 1012, 1013 are OFF state. Since the potential of the point E is LOW, the transistor 1009 becomes OFF state. Further, since the transistor 1006 is also OFF state, the source potential (potential of the point F) of the transistor 1009 remains at the HIGH level.

From the above situation, the output of the NAND circuit 1014 becomes HIGH regardless of the output value before the clock signal changes to HIGH.

At this time, if the coil 1001 generates a potential difference by a change of the magnetic flux to change the transistor 1005 to the ON state, the source potential (a potential of the point F) of the transistor 1009 becomes LOW because the drain potential of the transistor 1006 is at the LOW level and the transistors 1010, 1011 are OFF state. Since the potential of the point F is LOW, the transistor 1008 will be OFF state. Further, since the transistor 1005 is also OFF state, the source potential (potential of the point E) of the transistor 1008 remains at the HIGH level.

From the above circumstances, the output of the NAND circuit 1014 will be LOW regardless of an output value before the clock signal changes to HIGH That is, when the clock is at the HIGH level, the level of the reception object signal is determined by a change of the magnetic flux that the coil 1001 detects.

The request receiver circuits A 112 has the same function and configuration as the response receiver circuit A 111, detects the magnetic flux that the later-described request transmitter circuit B 142 generated, generates the serial request packet, and transmits the serial request packet to the parallelizer 2A 108.

The response transmitter circuits A 113 has the same function and configuration as the request transmitter circuit A 110, and generates a magnetic flux according to the serial response packet received from the serializer 2A 109.

Next, the modules included in the integrated circuit B 20 will be explained.

The CPU B 131 is a processor that controls the integrated circuit B 20 and the integrated circuit A 10 by accessing the memory B 134 through the router B 135, and executing a program currently held in the memory. Any access in the integrated circuit B 20 is performed with the same split protocol as accesses in the integrated circuit A 10.

The DSP B 132 is a DSP that performs calculation by accessing the memory B 134 through the router B 135, and executing a program currently held in the memory, and stores a calculation result in the memory B 134.

The DMAC B 133 is a DMAC that accesses the memory B 134 and the memory A 104 through the router B 135, and copies data between the memory B 134 and the memory A 104.

The memory B 134 is a storage device that receives the request packet from the router B 135, generates the response packet to the request packet, and transmits the response packet to the router B 135.

The router B 135 is a relay circuit that relays the request packet and the response packet that the CPU B 131, the DSP B 132, the DMAC B 133, the memory B 134, the parallelizer 1B 136, the serializer 1B 137, the serializer 2B 138, and the parallelizer 2B 139 transmit and receive.

The parallelizer is a conversion circuit that receives the serial request packet from the request receiver circuit B 140, converts the serial request packet into the request packet, and transmits the request packet to the router B 135.

The serializer is a conversion circuit that receives the response packet from the router B 135, converts the response packet into the serial response packet, and transmits the serial response packet to the response transmitter circuit B 141.

The serializer is a conversion circuit that receives the request packet from the router B 135, converts the request packet into the serial request packet, and transmits the serial request packet to the request transmitter circuit B 142.

The parallelizer is a conversion circuit that receives the serial response packet from the response receiver circuit B 143, converts the serial response packet into the response packet, and transmits the response packet to the router B 135.

The request receiver circuits B 140 has the same function and configuration as the request receiver circuit A 112, detects a magnetic flux that the request transmitter circuit A 110 generated, generates the serial request packet, and transmits the serial request packet to the parallelizer 1B 136.

The response transmitter circuit B 141 receives the serial response packet from the serializer B 137, and generates a magnetic flux according to the serial response packet.

The request transmitter circuit B 141 receives the serial request packet from the serializer 2B 138, and generates a magnetic flux according to the serial request packet.

The response receiver circuits B 143 has the same function and configuration as the request receiver circuit B 140, detects a magnetic flux that the response transmitter circuit A 113 generated, generates the serial response packet, and transmits the serial response packet to the parallelizer 2B 139.

Next, a physical arrangement of the modules included in the integrated circuit A 10, and a physical arrangement of the modules included in the integrated circuit B 20 will be explained with reference to drawings.

Figure 12:
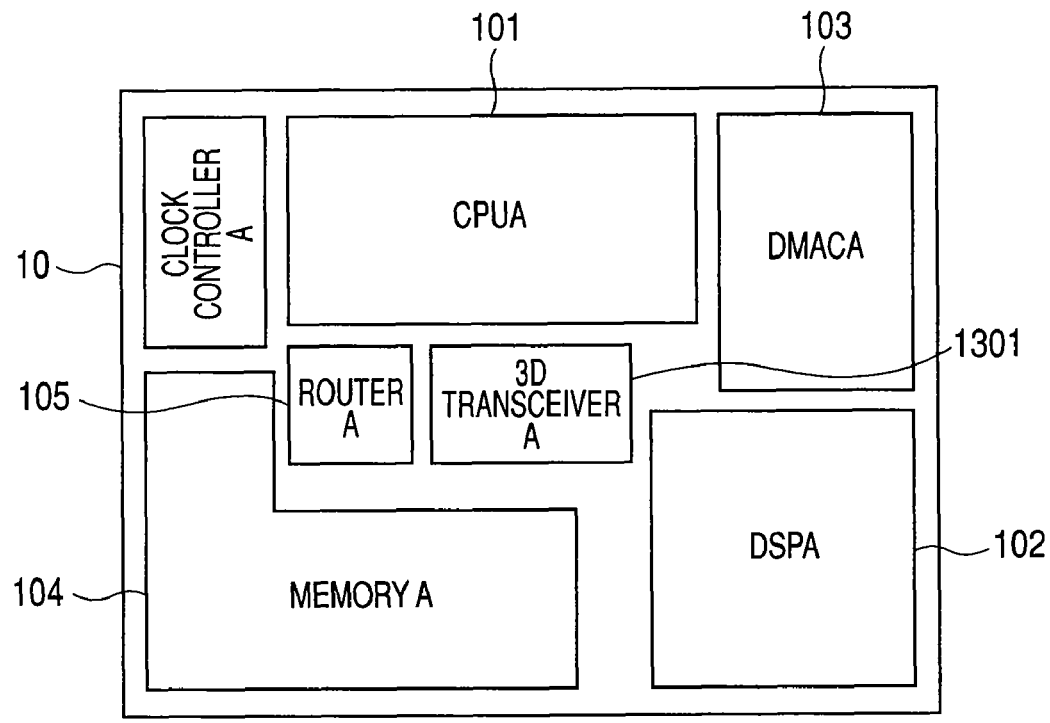
FIG. 12 is a floor plan diagram showing a physical arrangement of modules included in the integrated circuit A according to the first embodiment of the present invention.

FIG. 12 is a floor plan diagram showing a physical arrangement of the modules included in the integrated circuit A 10. The integrated circuit B 20 has the same floor plan as the integrated circuit A 10.

The integrated circuit A 10 is a rectangle. A 3D transceiver A 1301 is an area that includes the request transmitter circuit A 110, the response receiver circuit A 111, the request receiver circuit A 112, and the response transmitter circuit A 113, and further includes a central point A 1302 (not shown) of the integrated circuit A 10.

Figure 13:
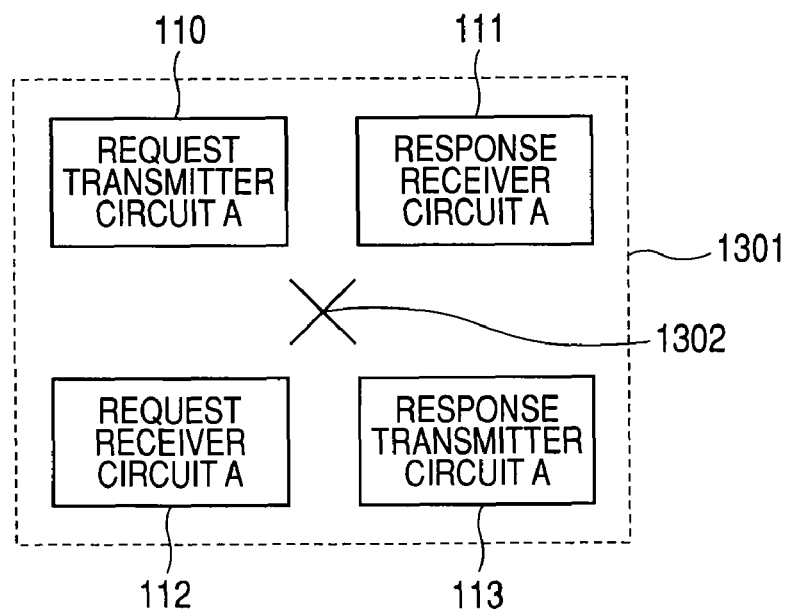
FIG. 13 is a partial floor plan diagram showing the physical arrangement of modules included in the 3D transceiver A according to the first embodiment of the present invention.

FIG. 13 is a partial floor plan diagram showing a spatial relation of the request transmitter circuit A 110, the response receiver circuit A 111, the request receiver circuit A 112, and the response transmitter circuit A 113 with the above-mentioned central point A 1302 in the 3D transceiver A 1301.

In the 3D transceiver A 1301, the request transmitter circuit A 110 and the response transmitter circuit A 113 are disposed in positions of point symmetry with reference to a central point A 1302.

Moreover, in the 3D transceiver A 1301, the response receiver circuit A 111 and the request receiver circuit A 112 are disposed in positions of point symmetry with reference to the central point A 1302.

Next, a relation between the transmission and reception terminals included in the 3D transceiver A 1301, the serial request packets, and the serial response packets will be explained with reference to drawings.

FIG. 14 is a diagram showing a position of the transmission and reception terminal (coil) included in the 3D transceiver A 1301.

A relation between the transmission coils TQ1 to TQ5 included in the request transmitter circuit A 110, and transmission signals of the serial request packets and the clock are as shown in FIG. 15.

A relation between the reception coils RS1 to RS5 included in the response receiver circuit A 111, and transmission signals of the serial response packets and the clock are as shown in FIG. 16.

A relation between the reception coils RQ1 to RQ5 included in the request receiver circuit A 112, and transmission signals of the serial request packets and the clock are as shown in FIG. 17.

A relation between the transmission coils TS1 to TS 5 included in the response transmitter circuit A 113 and transmission signals of the serial response packet and the clock is as shown in FIG. 18.

Next, a stacking method of the integrated circuit A 10 and the integrated circuit B 20 will be explained with reference to a drawing.

Figure 19:
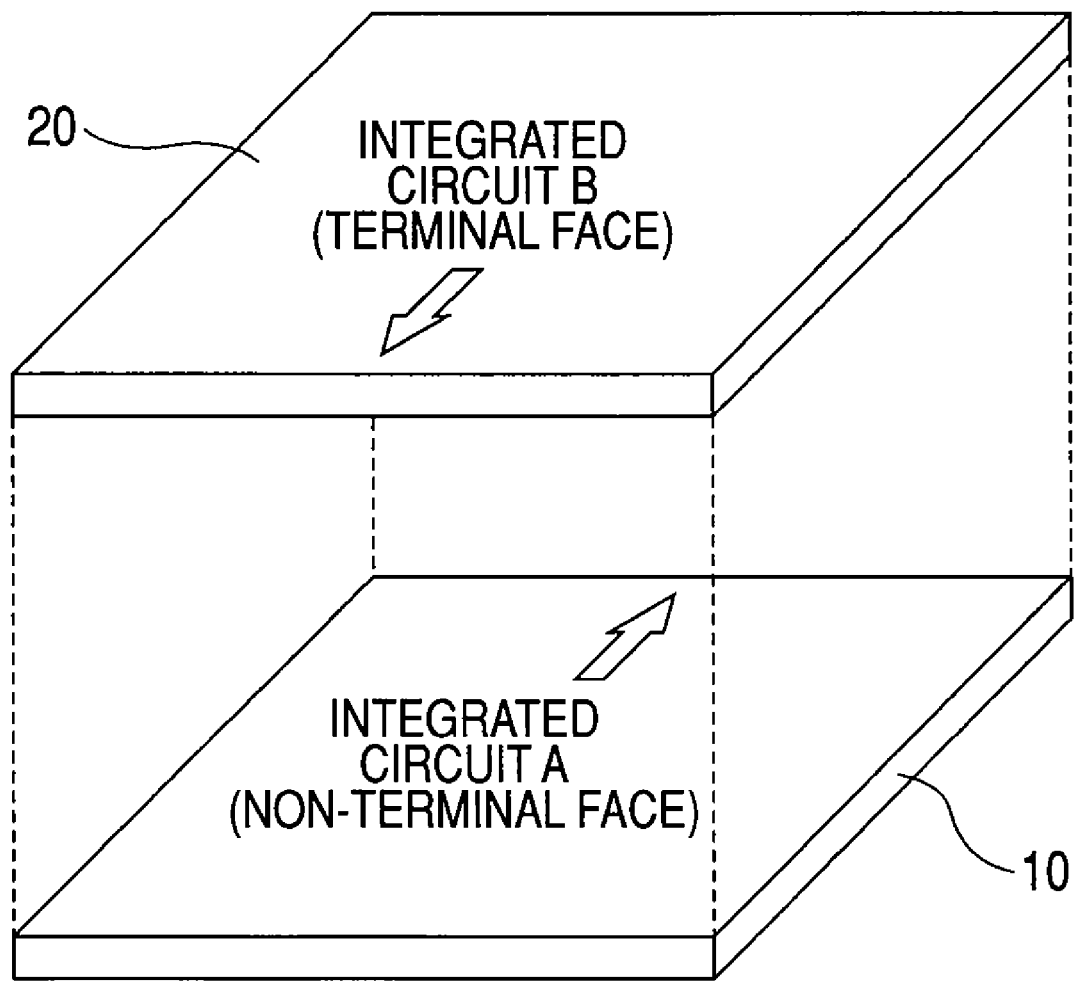
FIG. 19 is a diagram showing a stacking method of the integrated circuit A and the integrated circuit B according to the first embodiment of the present invention.

FIG. 19 shows the stacking method of the integrated circuit A 10 and the integrated circuit B 20.

The integrated circuit B 20 is stacked right above the integrated circuit A 10. Moreover, the stacking is done so that a face opposite to the terminal face of the integrated circuit A 10 adjoins a face opposite to the terminal face of the integrated circuit B 20. Furthermore, the stacking is done so that the integrated circuit B 20 is rotated in the horizontal direction by 180° around the central point of the integrated circuit B 20.

By this stacking, transmission terminals TQN (N is an integer from 1 to 5) of the integrated circuit A 10 are located right under reception terminals RQN of the integrated circuit B 20, and transmission terminals TSN (N is an integer from 1 to 5) of the integrated circuit A 10 are located right under reception terminals RSN of the integrated circuit B 20.

Therefore, all the 3D transmission terminals of the integrated circuit A 10 are located right under the 3D reception terminals of the integrated circuit B 20 that will make pairs with the terminals, respectively, and all the 3D reception terminals of the integrated circuit A 10 are located right under the 3D transmission terminal of the integrated circuit B 20 that will make pairs with the terminals, respectively.

As a result, the 3D coupling is formed for the integrated circuit A 10 and the integrated circuit B 20, and the integrated circuit A 10 and the integrated circuit B 20 can mutually transmit and receive the serial request packet and the serial response packet.

Moreover, inside the integrated circuit A 10 and the integrated circuit B 20, the router and a 3D coupling circuit are disposed adjacent to each other. This arrangement makes a packet transmission length in the integrated circuit shortest, and can make the delay time associated with packet transfer the minimum.

As explained above, the following effect can be obtained by constructing the modules that are included in the integrated circuit A 10 and the integrated circuit B 20, respectively, rotating the integrated circuit B 20 by 180° around the central point, and stacking it on the integrated circuit A 10.

This enables transfer between the initiator mounted on the integrated circuit A 10 and the target mounted on the integrated circuit B 20 to be performed with a smaller latency. Moreover, since acquisition of multiple terminals is also easy, the capacity of data transfer can be increased.

This enables transfer between the initiator mounted on the integrated circuit B 20 and the target mounted on the integrated circuit A 10 to be performed with a smaller latency. Moreover, since acquisition of multiple terminals is also easy, the capacity of data transfer can be increased.

It becomes possible to makes both the integrated circuit A 10 that will be located downward in the stacking and the integrated circuit B 20 that will be located upward with the same design. With this capability, a design cost and a mask cost can be curtailed compared to a case where a chip that will be located downward and a chip that will be located upward are designed individually.

Second Embodiment

In this second embodiment, two semiconductor integrated circuits that are housed in one package and are coupled by the 3D coupling circuit will be explained.

Figure 20:
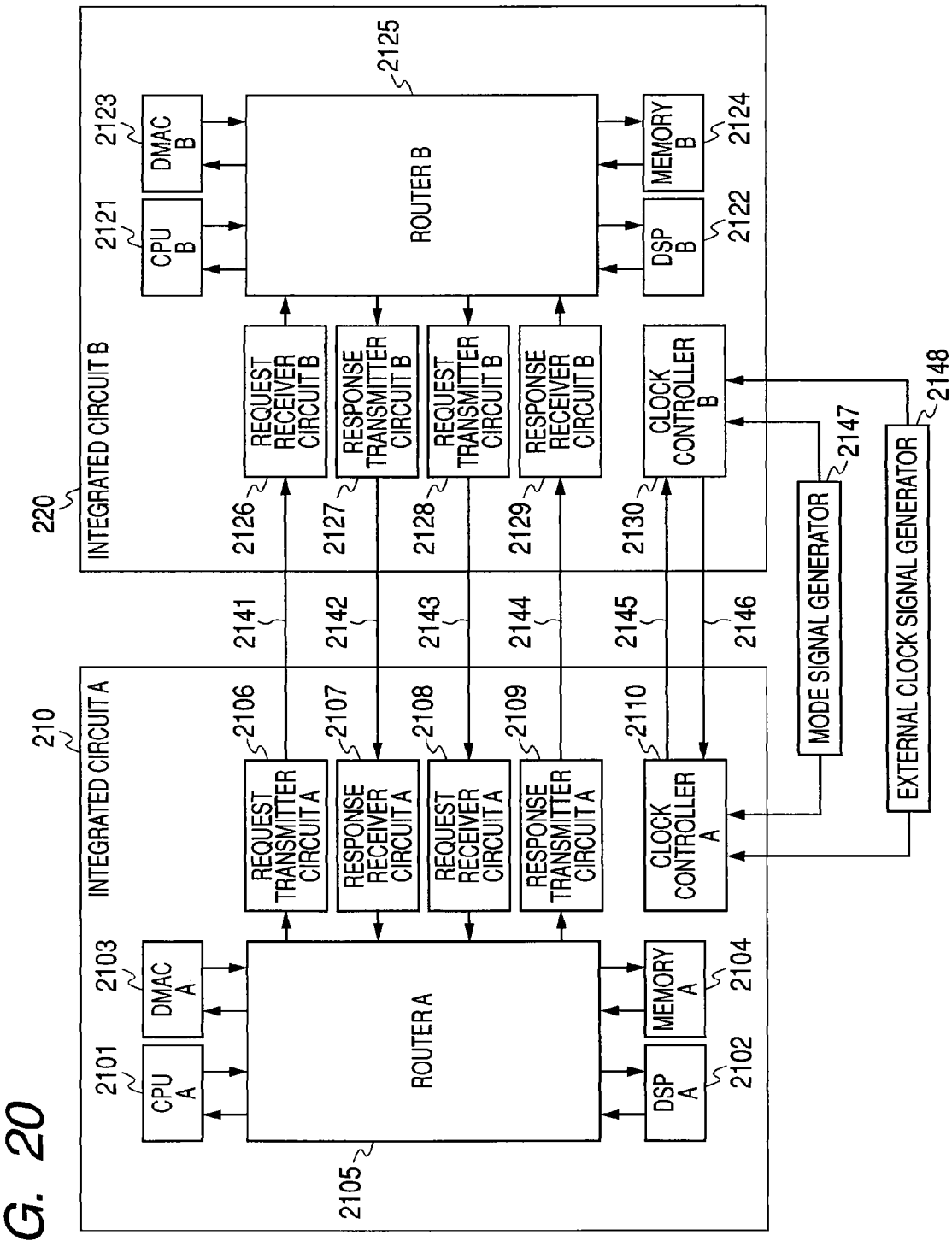
FIG. 20 is a block diagram showing a configuration of two semiconductor integrated circuits according to a second embodiment of the present invention.

FIG. 20 is a block diagram showing configurations of two semiconductor integrated circuits and their connection form in this second embodiment.

In this second embodiment, a case where two semiconductor integrated circuits having the same function and the same configuration are connected to each other to configure a circuit whose throughput is doubled compared to a case where each semiconductor integrated circuit is used alone will be explained.

Further, in this second embodiment, the invention aims at solving an increase in latency that associates with synchronization and packet serialization and parallelization by making the clocks of the both integrated circuits common.

An integrated circuit A 210 is constructed by including a CPU A 2101, a DSP A 2102, a DMAC A 2103, memory A 2104, a router A 2105, a request transmitter circuit A 2106, a response receiver circuit A 2107, a request receiver circuit A 2108, a response transmitter circuit A 2109, and a clock controller A 2110.

An integrated circuit B 220 is constructed by including a CPU B 2121, a DSP B 2122, a DMAC B 2123, memory B 2124, a router B 2125, a request receiver circuit B 2126, a response transmitter circuit B 2127, a request transmitter circuit B 2128, a response receiver circuit B 2129, and a clock controller B 2130.

Request transmitting inductive coupling AB2141 is inductive coupling that couples the request transmitter circuit A 2106 and the request receiver circuit B 2126.

Response receiving inductive coupling BA2142 is inductive coupling that couples the response receiver circuit A 2107 and the response transmitter circuit B 2127.

Request receiving inductive coupling BA2143 is inductive coupling that couples the request receiver circuit A 2108 and the request transmitter circuit B 2128.

Response transmission inductive coupling AB2144 is inductive coupling that couples the response transmitter circuit A 2109 and the response receiver circuit B 2129.

The CPU A 2101, the DSP A 2102, the DMAC A 2103, the memory A 2104, and the router A 2105 included in the integrated circuit A 210 have the same function and configuration as the CPU A 101, the DSP A 102, the DMAC A 103, the memory A 104, and the router A 105 of the first embodiment, respectively.

The CPU B 2121, the DSP B 2122, the DMAC B 2123, the memory B 2124, and the router B 2125 included in the integrated circuit B 220 have the same function and configuration as the CPU B 131, the DSP B 132, the DMAC B 133, the memory B 134, and the router B 135 of the first embodiment, respectively.

Formats of the request packet and the response packet that are transferred inside the integrated circuit A 210 and inside the integrated circuit B 220, respectively, are the same as those of the first embodiment.

Next, the request transmitter circuit A 2106 will be explained with reference to drawings.

The request transmitter circuit A 2106 is a relay circuit for transmitting the request packet that the router A 2105 transmitted to the integrated circuit B 220.

Figure 21:
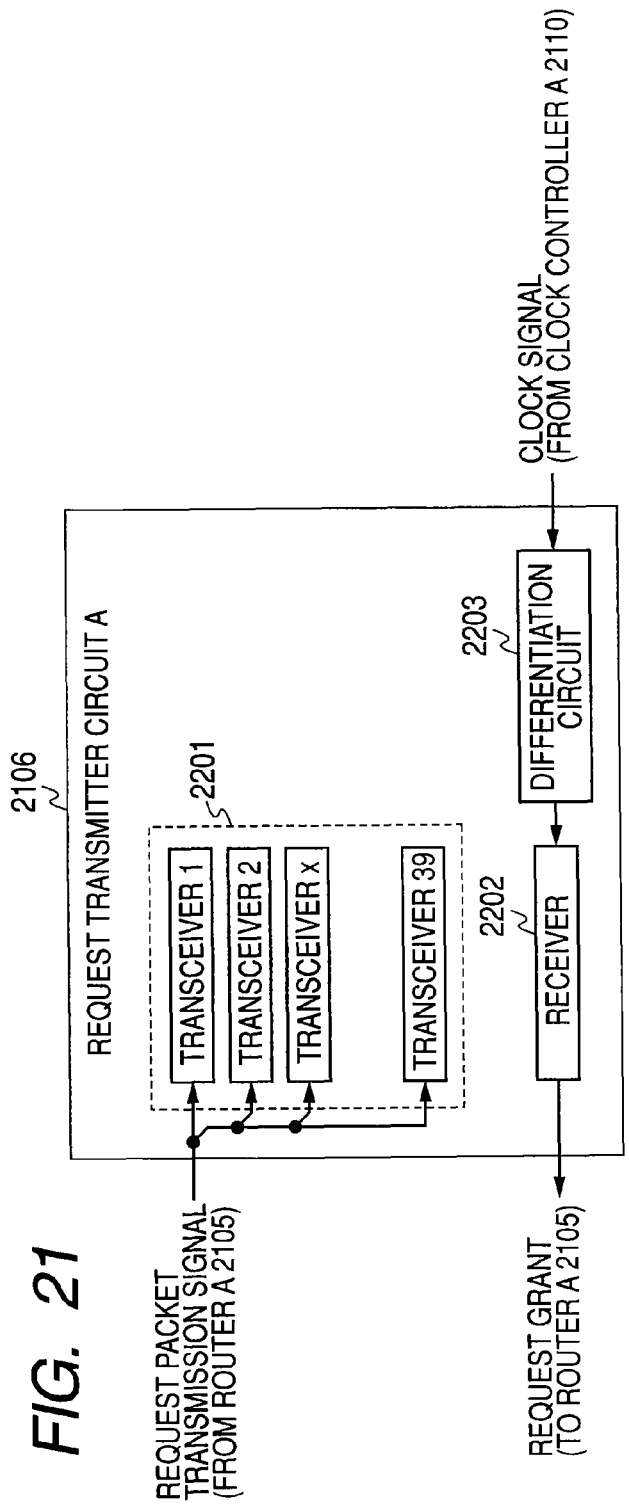
FIG. 21 is a block diagram showing a configuration of a request transmitter circuit A according to the second embodiment of the present invention.

FIG. 21 is a block diagram showing a configuration of the request transmitter circuit A 2106.

The request transmitter circuit A 2106 includes a transceiver group 2201 consisting of the same number of transceivers as the number of the request packet transmission signals, i.e., 39 transceivers, a receiver 2202, and a differentiation circuit 2203. The transceivers included in the transceiver group 2201 are connected to the request packet transmitting signals supplied from the router A 2105, respectively. An output terminal of the receiver 2202 is connected to a request grant input terminal of the router A 2105. An input terminal of the receiver 2202 is connected to an output terminal of the differentiation circuit 2203, and an input terminal of the differentiation circuit 2203 is connected to the clock signal that the clock controller A 2110 outputs.

The transceiver has the same function and configuration as the transceiver that is included in the request transmitter circuit A 110 explained in the first embodiment.

Figure 22:
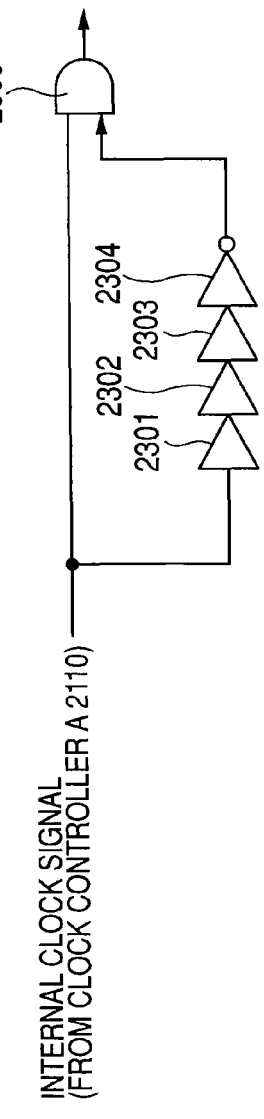
FIG. 22 is a circuit diagram showing a configuration of a differentiation circuit according to the second embodiment of the present invention.

FIG. 22 is a circuit diagram showing a configuration of the differentiation circuit 2203.

The differentiation circuit 2203 is constructed with buffers 2301 to 2303, an inverter 2304, and an AND circuit 2305, and is a circuit for converting a rising edge of the inputted clock into a positive pulse whose period of being at the HIGH level is equal to a delay time of the buffers 2301 to 2303 and the inverter 2304.

The receiver 2202 is the same as the receiver that is included in the response receiver circuit A 111 explained in the first embodiment.

Next, the response receiver circuit A 2107 will be explained with reference to a drawing.

The response receiver circuit A 2107 is a relay circuit for transmitting the response packet that the integrated circuit B 220 transmitted to the router A 2105.

Figure 23:
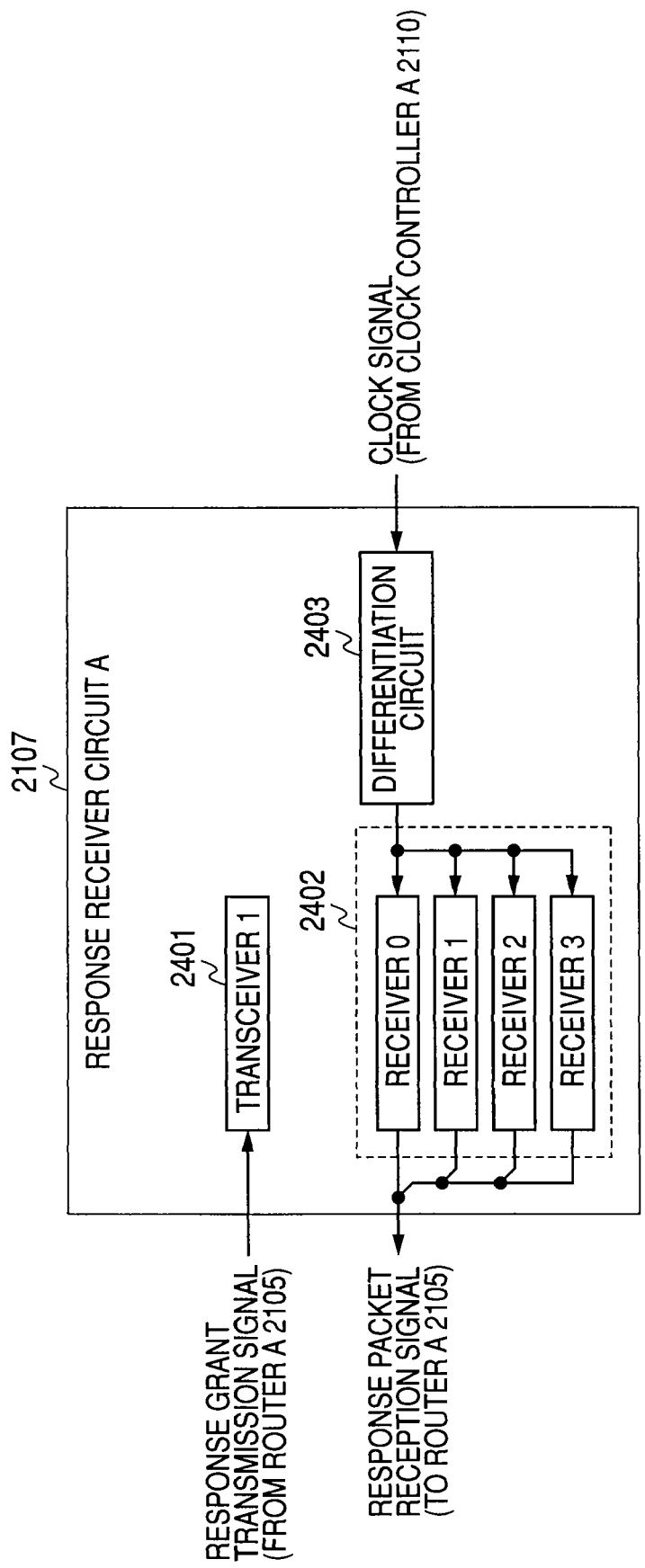
FIG. 23 is a block diagram showing a configuration of a response receiver circuit A according to the second embodiment of the present invention.

FIG. 23 is a block diagram showing a configuration of the response receiver circuit A 2107.

The response receiver circuit A 2107 includes a receiver group 2402 consisting of the same number of receivers as the number of input terminals for response packet reception of the router A 2105, i.e., 23 receivers and a differentiation circuit 2403.

An input terminal of the transceiver is connected to a response grant output terminal of the router A 2105. Output terminals of the receivers are connected to the respective input terminals for response packet reception of the router A 2105. An input terminal of the differentiation circuit 2403 is connected to a clock signal that the clock controller A 2110 outputs, and an output terminal of the differentiation circuit 2403 is connected to respective clock terminals of the receivers.

A transceiver 2401 is the same as the transceiver that is included in the request transmitter circuit A 110 explained in the first embodiment.

The receivers of the receiver group 2402 have the same function and configuration as the receiver that is included in the response receiver circuit A 111 explained in the first embodiment.

The differentiation circuit 2403 has the same function and configuration as the differentiation circuit 2203.

The request receiver circuit A 2108 has analogous function and configuration as the response receiver circuit A 2107, and is a relay circuit that transmits the request packet that the integrated circuit B 220 transmitted to the router A 2105.

The response transmitter circuit A 2109 is a relay circuit for transmitting the response packet that the router A 2105 transmitted to the integrated circuit B 20.

The clock controller A 2110 is a circuit for generating the clock signal that the integrated circuit A 210 uses. Below, the clock controller A 2110 will be explained with reference to a drawing.

Figure 24:
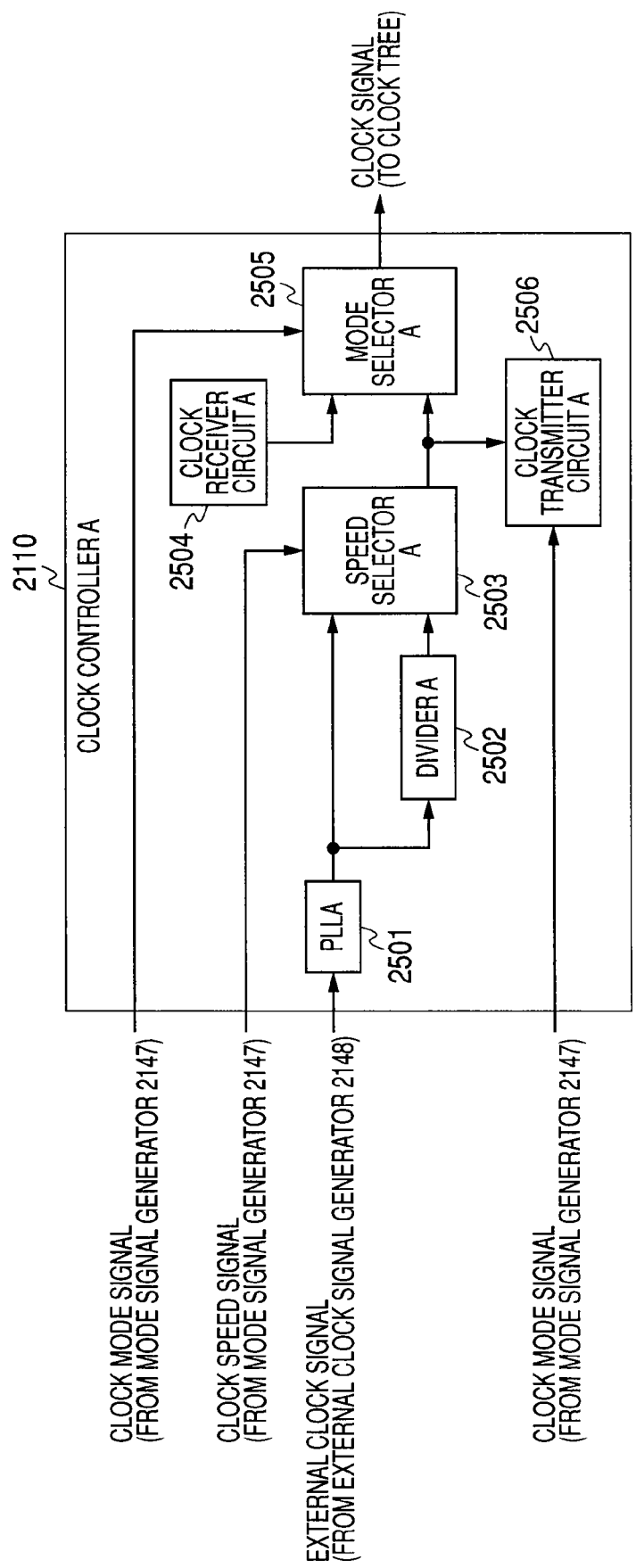
FIG. 24 is a block diagram showing a configuration of a clock controller A according to the second embodiment of the present invention.

FIG. 24 is a block diagram showing a configuration of the clock controller A 2110.

The clock controller A 2110 is constructed by including a PLL A 2501, a divider A 2502, a speed selector A 2503, a clock receiver circuit A 2504, a mode selector A 2505, and a clock transmitter circuit A 2506.

The PLL A 2501 is a PLL (Phase Locked Loop) circuit that grabs an external clock signal from an external clock signal generator 2148, generates a PLL output clock signal having the same frequency and period as the external clock signal, and supplies the PLL output clock signal to the divider A 2502 and the speed selector A 2503.

The divider A 2502 is a frequency divider that generates a divided clock whose frequency is half the frequency of the PLL output clock signal from the PLL output clock signal grabbed from the PLL A 2501, and supplies the divided clock to the speed selector A 2503.

The speed selector A 2503 is a selection circuit that, when the clock speed signal supplied from a mode signal generator 2147 is at the HIGH level, supplies the PLL output clock to the mode selector A 2505, and that, when the clock speed signal is at the LOW level, supplies the divided clock to the mode selector A 2505.

The mode selector A 2505 is a selection circuit that, when the clock mode signal supplied from the mode signal generator 2147 is at the HIGH level, supplies the clock signal supplied from the speed selector A 2503 to a clock tree outside the clock controller A 2110, and that, when the clock mode signal is at the LOW level, supplies the clock signal supplied from the clock receiver circuit A 2504 to the clock tree outside the clock controller A 2110.

The clock receiver circuit A 2504 is a receiver circuit for receiving a clock signal from the outside of the integrated circuit A 210 through the 3D coupling. Below, configurations and operations of the clock receiver circuit A 2504 and the clock transmitter circuit A 2506 will be explained with reference to drawings.

Figure 25:
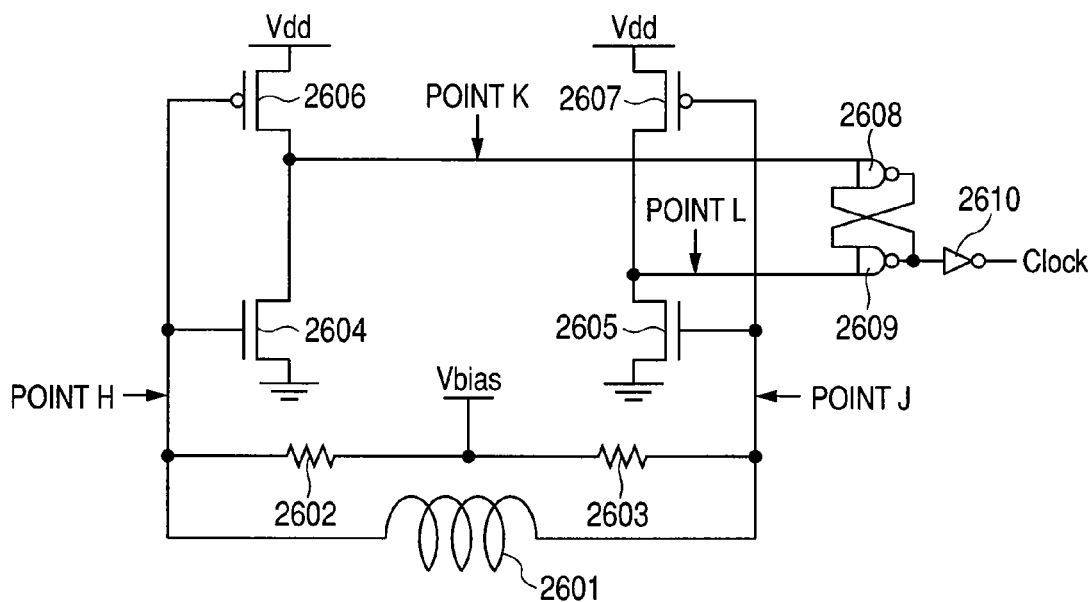
FIG. 25 is a circuit diagram showing a configuration of a clock receiver circuit A according to the second embodiment of the present invention.

FIG. 25 is a circuit diagram showing a configuration of the clock receiver circuit A 2504.

The clock receiver circuit A 2504 is a circuit that receives a magnetic flux that the integrated circuit B 220 transmits and generates a clock signal that the integrated circuit A 210 uses from the magnetic flux, and is constructed by including a coil 2601, resistances 2602, 2603, transistors 2604 to 2607, NAND circuits 2608, 2609, and an inverter 2610.

The coil 2601 generates a potential difference according to the rate of change of the magnetic field. In this second embodiment, when the coil 2601 is not generating the potential difference, the transistor 2604 is OFF state and the transistor 2606 is ON state. For this reason, when the coil 2601 is not generating the potential difference, the potential of the point K is HIGH. Similarly, when the coil 2601 is not generating a potential difference, a transistor 2605 is OFF state and the transistor 2607 is ON state. For this reason, when the coil 2601 is not generating the potential difference, the potential of the point L is HIGH.

Therefore, when the coil 2601 is not generating the potential difference, output values of the NAND circuits 2608, 2609 are held, and an output value of the inverter 2610 that inverts an output level of the NAND circuit 2609 is also held.

When the magnetic field imposing on the coil 2601 increases, the potential of the point H will become higher than the potential of the point J, and will bring the transistor 2606 into an ON state and at the same time bring the transistor 2604 into an ON state. On the other hand, when the magnetic field imposing on the coil 2601 decrease, the potential of the point J will become higher than the potential of the point H, and will bring the transistor 2605 into an ON state and bring the transistor 2607 into an OFF state.

For this reason, when the magnetic field imposing on the coil 2601 increases, the potential of the point K will change to the LOW level, and the output level of the inverter 2610 will change to HIGH; when the magnetic flux imposing on the coil 2601 decreases, the potential of the point L will change to the LOW level, and the output level of the inverter 2610 will change to LOW.

Figure 26:
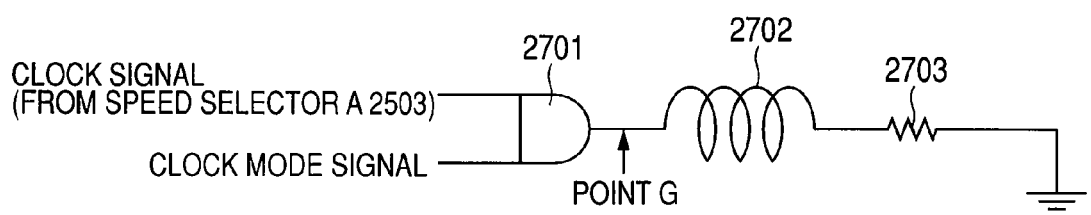
FIG. 26 is a circuit diagram showing a configuration of a clock transmitter circuit A according to the second embodiment of the present invention.

FIG. 26 is a circuit diagram showing a configuration of the clock transmitter circuit A 2506.

The clock transmitter circuit A 2506 is a circuit for outputting the clock signal that the speed selector A 2503 outputs to the outside of the integrated circuit A 210 through the 3D coupling, and is constructed by including an AND circuit 2701, a coil 2702, and a resistance 2703.

When the clock mode signal is HIGH, the clock transmitter circuit A 2506 generates a magnetic field when the clock signal that the speed selector A 2503 outputs is HIGH, and does not generate the magnetic flux when the clock signal that the speed selector A 2503 outputs is LOW.

When the clock mode signal is LOW, the clock transmitter circuit A 2506 does not generate the magnetic flux.

Next, operations when the clock receiver circuit A 2504 receives a magnetic field that the clock transmitter circuit A 2506 generated and generates a clock signal will be explained with reference to a drawing.

Incidentally, the coil 2601 and the coil 2702 are disposed being stacked vertically, so that the coli 2702 can capture the magnetic field generated by the coil 2601.

Figure 27:
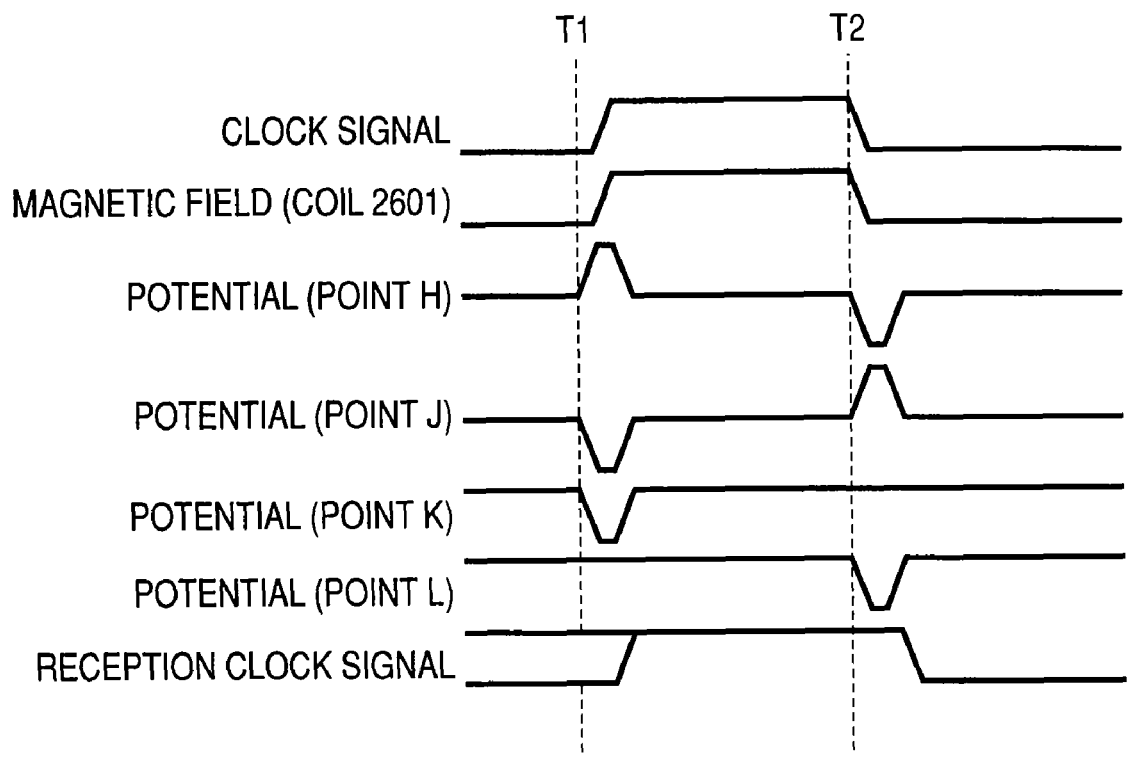
FIG. 27 is a timing chart showing a situation of clock transmission and reception according to the second embodiment of the present invention.

FIG. 27 is a timing chart showing a situation of clock transmission and reception.

The clock signal that the speed selector A 2503 generates is supplied to the coil 2702 through the AND circuit 2701. For this reason, a magnetic field proportional to the potential of the clock signal that the speed selector A 2503 generates is generated.

The coil 2702 generates a potential difference at the both ends of the coil 2601 according to the rate of change of the magnetic field. When the clock signal that the speed selector A 2503 generates changes from LOW to HIGH, the coil 2702 generates a potential difference of a positive direction; when the clock signal that the speed selector A 2503 generates changes from HIGH to LOW, the coil 2702 generates the potential difference of a negative direction.

As explained previously, when the coil 2702 generates a magnetic field of the positive direction, the clock receiver circuit A 2504 outputs and holds a signal of the HIGH level; when the coil 2702 generates a magnetic field of the negative direction, the clock receiver circuit A 2504 outputs and holds a signal of the LOW level As a result, a signal that is delayed by a delay time of circuits included in the clock transmitter circuit A 2506 and the clock receiver circuit A 2504 with reference to the clock signal that the speed selector A 2503 generates is outputted from the clock receiver circuit A 2504.

Next, the mode signal generator 2147 will be explained. The mode signal generator 2147 supplies a clock mode signal that specifies a clock used and a clock speed signal that notifies a clock frequency to the integrated circuit A 210 and the integrated circuit B 220.

In this second embodiment, the mode signal generator 2147 supplies a signal of the HIGH level, as the clock speed signal, to the integrated circuit A 210, and supplies a signal of the LOW level, as the clock speed signal, to the integrated circuit B 220, respectively.

In this second embodiment, the mode signal generator 2147 supplies a signal of the HIGH level, as the clock mode signal, to the integrated circuit A 210, and supplies a signal of the LOW level, as the clock mode signal, to the integrated circuit B 220, respectively.

The external clock signal generator 2148 supplies an external clock to the integrated circuit A 210.

The mode signal generator 2147 and the external clock signal generator 2148 that were explained above supply the clock signal having the same frequency as the external clock that the clock controller A 2110 generates using the external clock to the clock tree of the integrated circuit A 210. The clock tree of the integrated circuit B 220 is supplied with the clock signal that is supplied from the integrated circuit A 210 through the 3D coupling circuit.

Here, an advantage of supplying the clock from the speed selector A 2503 of the integrated circuit A 210 to the integrated circuit B 220 will be explained with reference to drawings.

Figure 28:
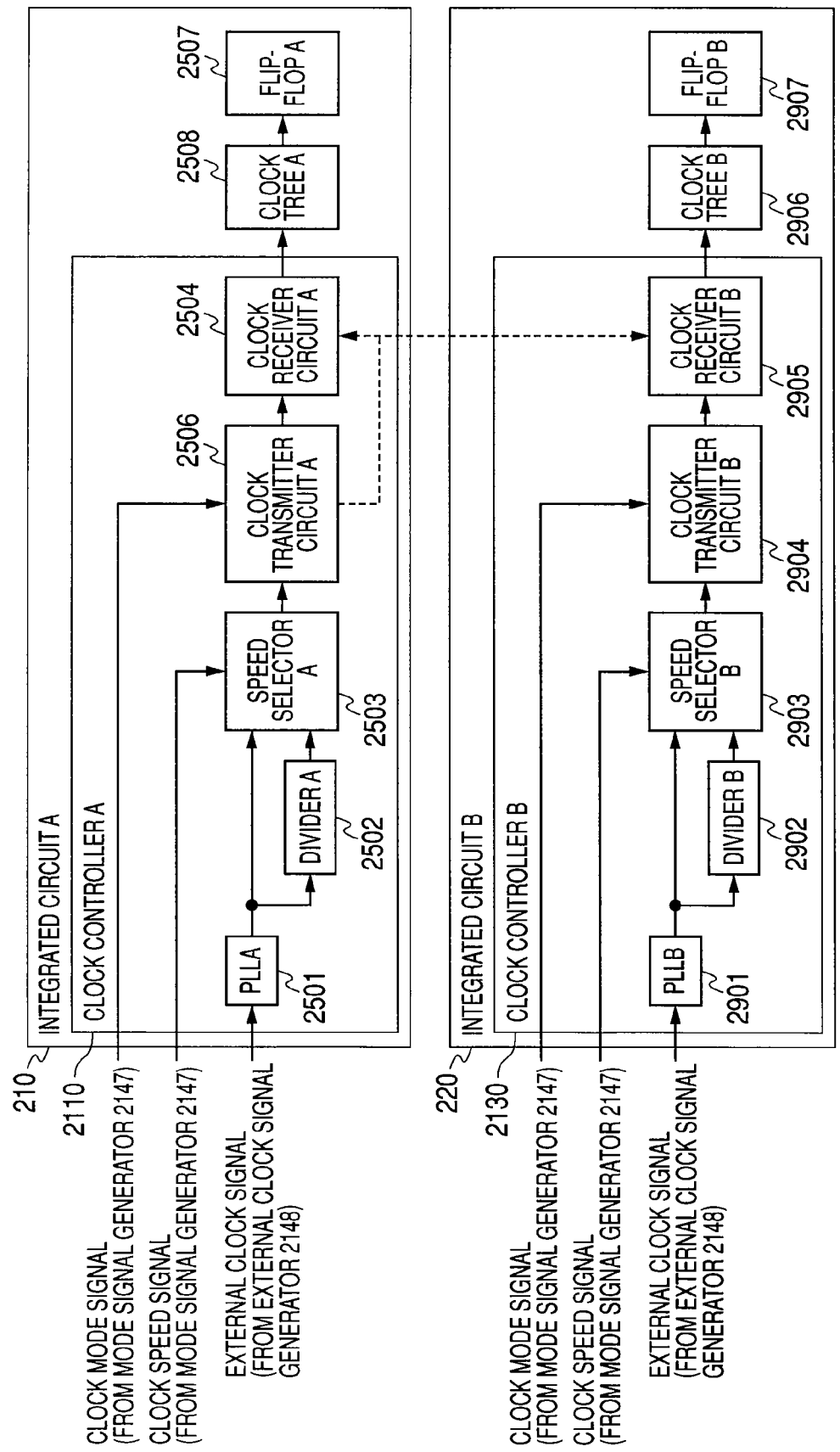
FIG. 28 is a clock system diagram of the integrated circuit A and the integrated circuit B according to the second embodiment of the present invention.

FIG. 28 is a clock system diagram of the integrated circuit A 210 and the integrated circuit B 220 according to the present invention.

A flip-flop 2507 inside the integrated circuit A 210 is supplied with a clock from the external clock signal generator 2148 via the PLL A 2501, the divider A 2052, the speed selector A 2503, the clock transmitter circuit A2506, the clock receiver circuit A 2504, and a clock tree A 2508.

Similarly, a flip-flop 2907 inside the integrated circuit B 220 is supplied with a clock from the external clock signal generator 2148 via the PLL A 2501, the divider A 2502, the speed selector A 2503, the clock transmitter A 2506, a clock receiver circuit B 2905, and a clock tree B 2906.

In this second embodiment as described above, since transmission and reception of a packet are performed between the integrated circuit A 210 and the integrated circuit B 220, the flip-flop of the integrated circuit A 210 and the flip-flop of the integrated circuit B 220 should be supplied with clocks whose delay time difference, i.e., clock skew, is small.

If a clock propagation path is made common, the clock skew is easy to suppress; if the clock propagation path is different, the clock skew is hard to suppress.

In this second embodiment, the PLL A 2501, the divider A 2502, the speed selector A 2503, and the clock transmitter circuit A 2506 are common, in the propagation path of the clock that leads to the flip-flop in the integrated circuit A 210 and in the propagation path of the clock that leads to the flip-flop in the integrated circuit B 220. What are different in the two paths are only the clock receiver circuit A 2504, the clock tree A 2508, the clock receiver circuit B 2905, and the clock tree B 2906.

Figure 29:
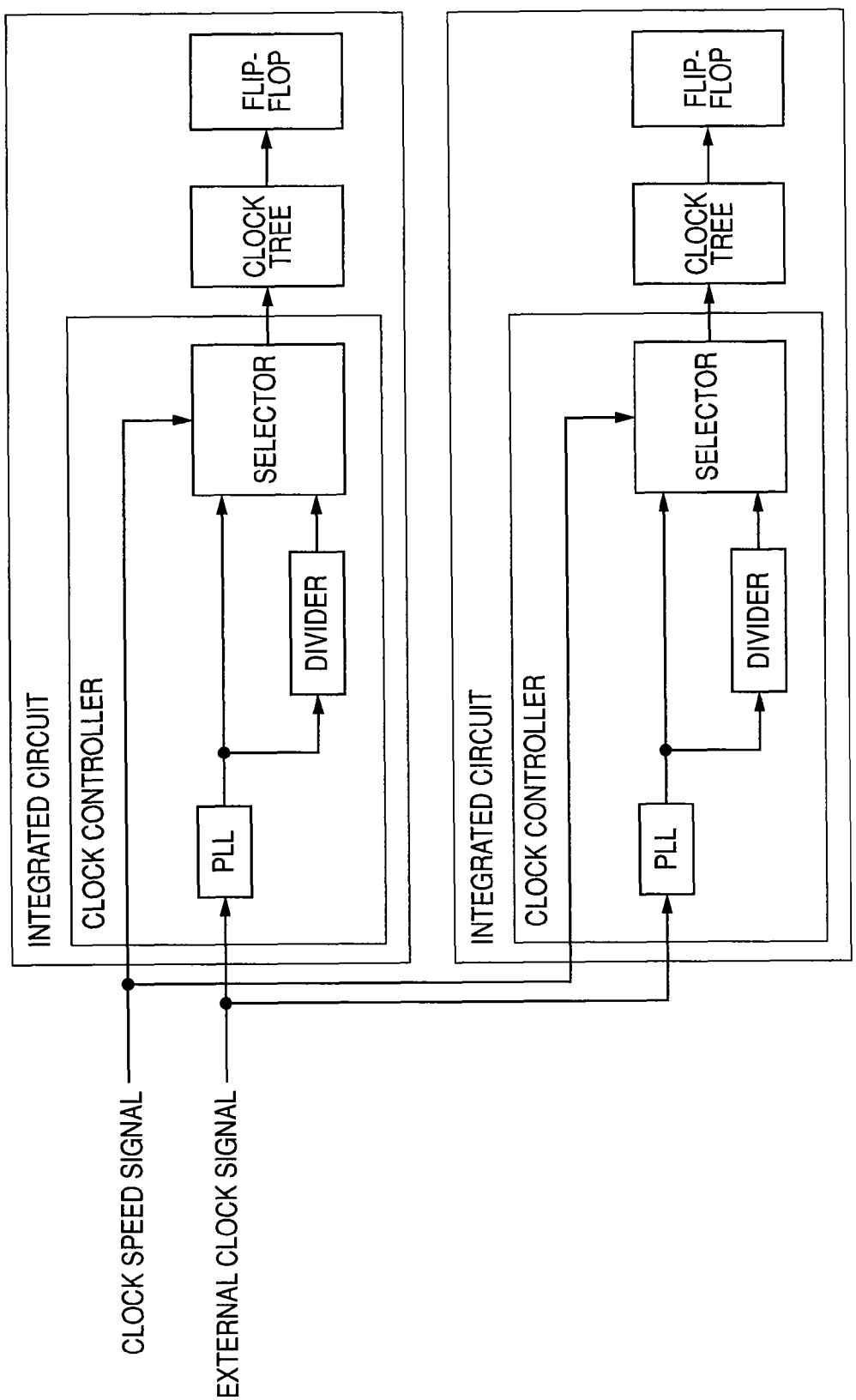
FIG. 29 is a clock system diagram of the two integrated circuits examined as a premise of the present invention.

On the other hand, conventionally, since it is general to supply an external clock to each chip, as shown in FIG. 29, clock signal wiring from the external clock signal generator 2148 to the each integrated circuit, a PLL, a divider, a selector, a clock receiver circuit, and a clock tree are all independent; therefore, clock skew suppression is more difficult than the clock configuration of the present invention.

Next, a logical structure of the data transfer path of this second embodiment will be explained.

Figure 30:
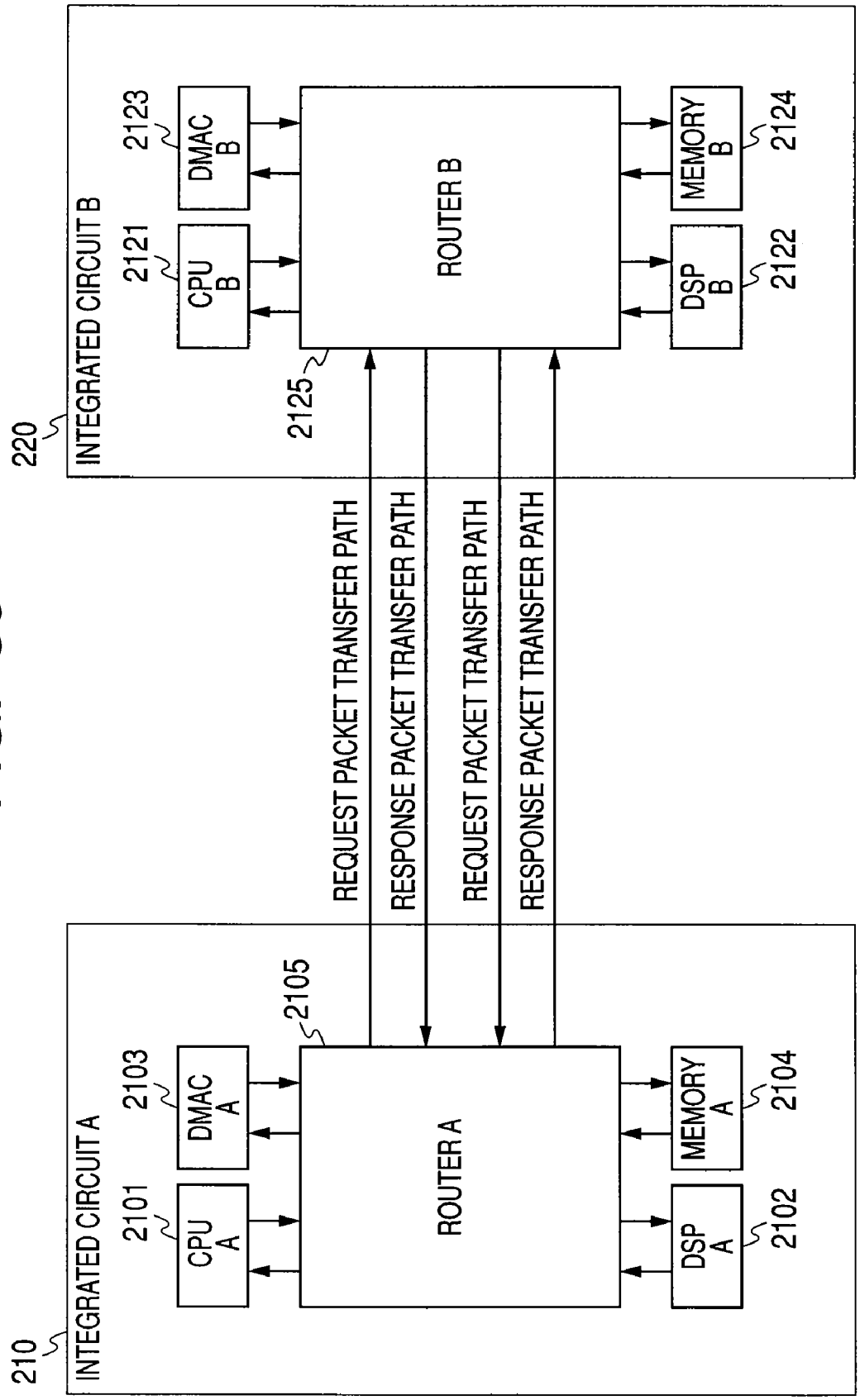
FIG. 30 is a block diagram showing data transfer paths of the integrated circuit A and the integrated circuit B according to the second embodiment of the present invention.

FIG. 30 is a block diagram showing the data transfer paths of the integrated circuit A 210 and of the integrated circuit B 220 both of the present invention.

As explained previously, propagation delays of the 3D coupling transmitter circuit and of the 3D coupling receiver circuit are small compared with a clock period.

Therefore, as shown in FIG. 20, disposing the 3D coupling transmitter/receiver circuits adjacent to the routes of the integrated circuits enables request packet transfer from the initiator to the target over a plurality of the integrated circuits to be performed with a short latency.

Next, positions in the integrated circuit of the functional modules mounted on the integrated circuit will be explained with reference to a drawing.

Figure 31:
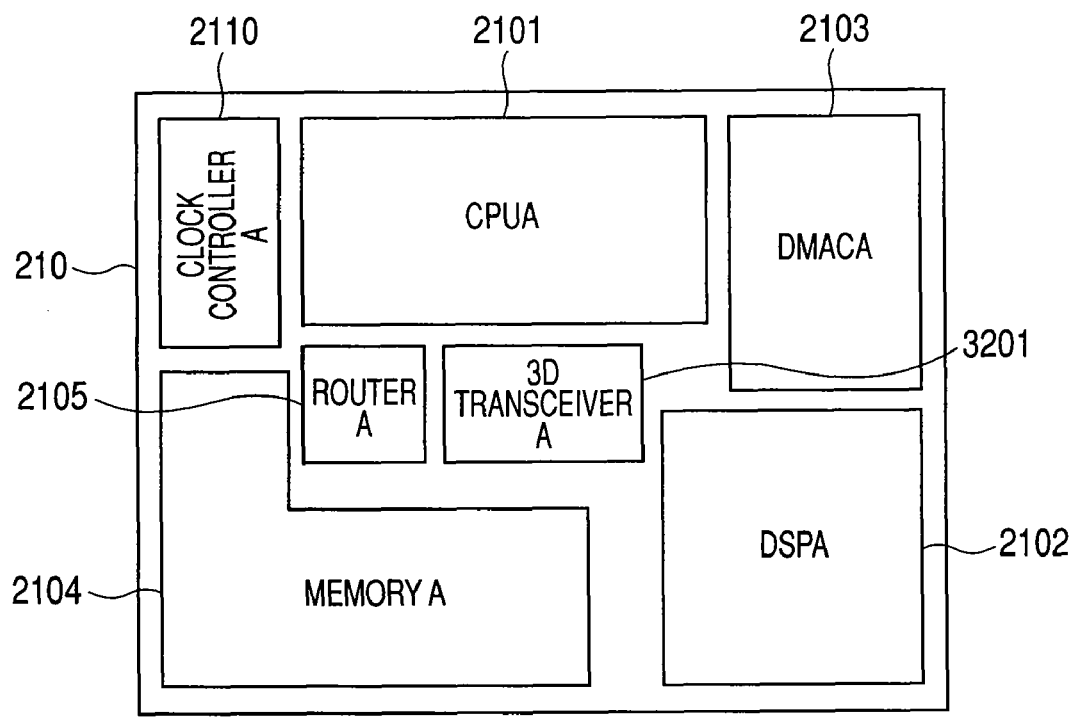
FIG. 31 is a floor plan diagram showing positions of functional modules inside the integrated circuit A mounted on the integrated circuit A according to the second embodiment.

FIG. 31 is a floor plan diagram showing positions in the integrated circuit A 210 of the functional modules mounted on the integrated circuit A 210.

A 3D transceiver A 3201 is a thee-dimensional transceiver constructed with the request transmitter circuit A 2106, the response receiver circuit A 2107, the request receiver circuit A 2108, and the response transmitter circuit A 2109, and the clock receiver circuit A 2504 and the clock transmitter circuit A 2506 of the clock controller A 2110.

Figure 32:
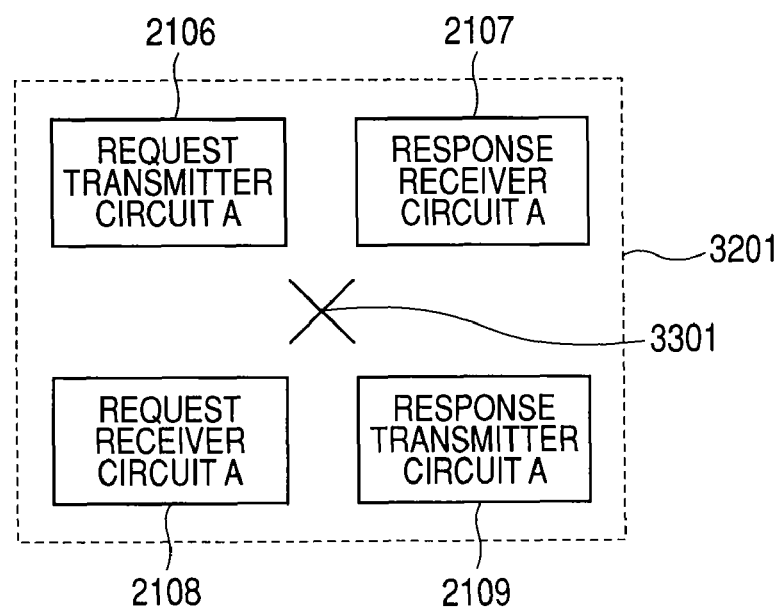
FIG. 32 is a diagram an arrangement of a 3D transceiver A according to the second embodiment of the present invention.

FIG. 32 is a diagram showing a spatial relation of the request transmitter circuit A 2106, the response receiver circuit A 2107, the request receiver circuit A 2108, and the response transmitter circuit A 2109 in the 3D transceiver A 3201. A central point A 3301 is a central point of the integrated circuit A 210. The coils of the clock receiver circuit A 2504 and the clock transmitter circuit A 2506 are disposed with respective central points adjusted to the central point A 3301.

The request transmitter circuit A 2106 and the response transmitter circuit A 2109 are disposed in positions of point symmetry with reference to the central point A 3301; the response receiver circuit A 2107 and the request receiver circuit A 2108 are disposed in positions of point symmetry with reference to the central point A 3301.

The coil included in the clock receiver circuit A 2504 and the coil included in the clock transmitter circuit A 2506 are disposed so that their centers of gravity may coincide with the central point A 3301 when seeing them from the above of the chip terminal face.

FIG. 33 is a diagram showing structures of the transmission coil and the reception coil that are included in the request transmitter circuit A 2106.

FIG. 34 is a diagram showing structures of the transmission coil and the reception coil that are included in the request receiver circuit A 2108.

FIG. 35 is a diagram showing structures of the transmission coil and of the reception coil both included in the response transmitter circuit A 2109.

FIG. 36 is a diagram showing structures of the transmission coil and of the reception coil both included in the response receiver circuit A 2107.

The CLK are a coil included in the clock receiver circuit A 2504 and a coil included in the clock transmitter circuit A 2506.

In the 3D transceiver A 3201, the TQ1 is disposed in a position of point symmetry to the TS1 with reference to the central point A 3301; the RQ1 is disposed in a position of point symmetry to the RS1 with reference to the central point A 3301. In the following, similarly with the above, terminals TQ'N' (N is an integer from 2 to 39) and terminals TS'M' (M is an integer from 2 to 23) are disposed in positions of point symmetry with reference to the central point A 3301. Terminals RQ'N' (N is an integer from 2 to 39) and terminals RS'M' (M is an integer from 2 to 23) are disposed in positions of point symmetry with reference to the central point A 3301.

Next, a stacking method of the integrated circuit A 210 and the integrated circuit B 220 will be explained with reference to a drawing.

Figure 37:
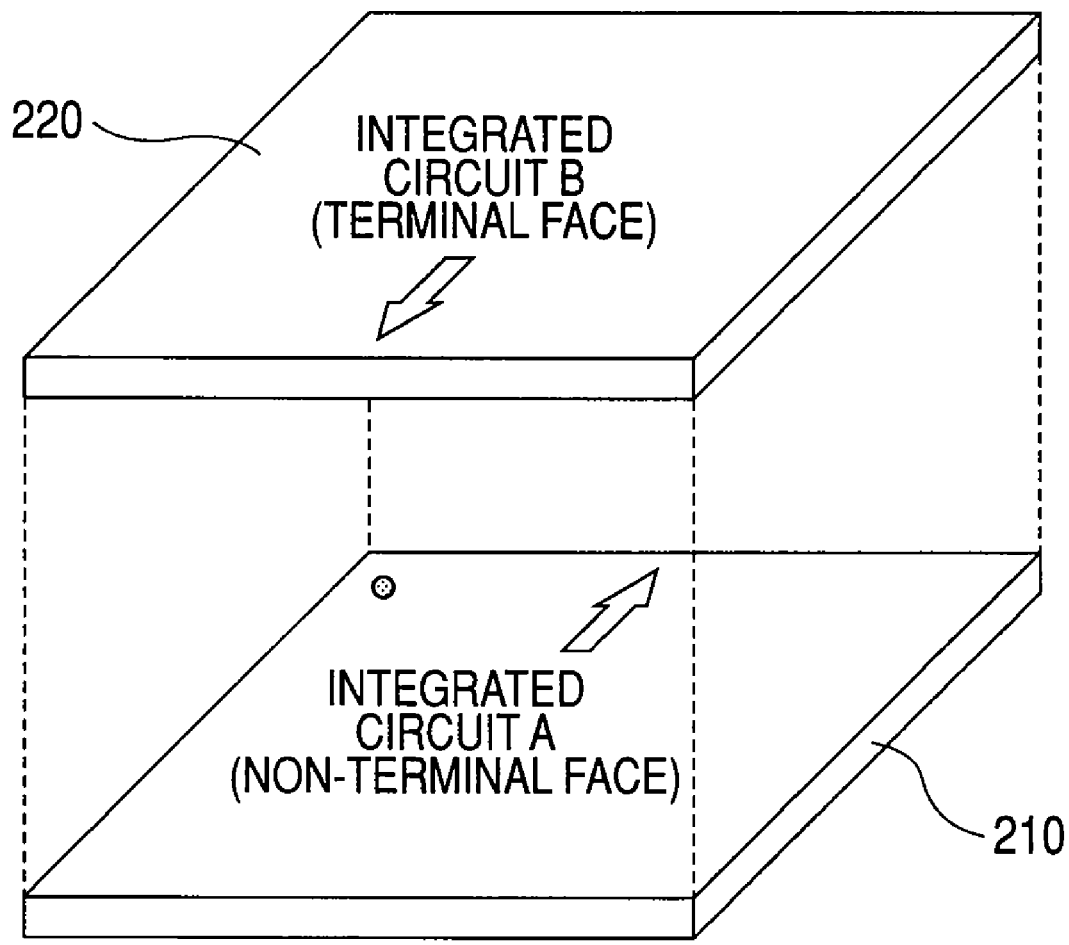
FIG. 37 is a diagram showing a stacking method of the integrated circuit A and the integrated circuit B according to the second embodiment of the present invention.

FIG. 37 is a diagram showing the stacking method of the integrated circuit A 210 and the integrated circuit B 220.

The integrated circuit B 220 is stacked right above the integrated circuit A 210.

Each of the integrated circuit A 210 and the integrated circuit B 220 has a terminal face and a non-terminal face on its backside. Bonding wires and micro bumps are connected to the terminal face. The integrated circuit A 210 is stacked on the integrated circuit B 220 so that the non-terminal face of the former contacts the terminal face of the latter. Further, the stacking is done so that the integrated circuit B 220 is rotated in the horizontal direction by 180° around the central point of the integrated circuit B 220.

By this stacking, terminals TQ'N' (N is an integer from 1 to 39) of the integrated circuit A 210 are located right under terminals RQ'N' of the integrated circuit B 220, and terminals TS'M' (M is an integer from 1 to 23) of the integrated circuit A 210 are located right under terminals RS'M' of the integrated circuit B 220. Further, the CLK terminal of the integrated circuit B 220 overlaps the CLK terminal of the integrated circuit A 210.

Therefore, all the 3D transmission terminals of the integrated circuit A 210 overlap the 3D reception terminals of the integrated circuit B 220 that communicates with the terminals by inductive coupling, and all the 3D reception terminals of the integrated circuit A 210 overlap the 3D transmission terminal of the integrated circuit B 220 that communicates with the terminals by inductive coupling.

This structural configuration forms inductive coupling in the integrated circuit A 210 and the integrated circuit B 220, and enables the integrated circuit A 210 and the integrated circuit B 220 to transmit and receive a clock, the request packet, and the response packet mutually.

By forming the integrated circuit A 210 and the integrated circuit B 220 as explained above, rotating the integrated circuit B 220 by 180° around the central point further, and stacking it on the integrated circuit A 210, the following effects are attained.

Transfer between the initiator mounted on the integrated circuit A 210 and the target mounted on the integrated circuit B 220 can be performed with a low latency. Moreover, transfer between the initiator mounted on the integrated circuit B 220 and the target mounted on the integrated circuit A 210 can also be performed with a low latency.

This method makes it possible to make the integrated circuit A 210 located downward in the stacking and the integrated circuit B 220 located upward in the stacking with the same design. This capability can reduce the design const and the mask cost of the integrated circuit compared to a case where the integrated circuit A 210 located downward in the stacking and the integrated circuit B 220 located upward in the stacking.

Since the clock skew between the integrated circuit A 210 and the integrated circuit B 220 can easily be made small, an operation frequency limit when bringing a transfer between the integrated circuit A 210 and the integrated circuit B 220 into synchronous transmission is high. Therefore, even when increasing a transfer throughput between the integrated circuit A 210 and the integrated circuit B 220, use of neither the asynchronous transfer system nor the source synchronous transfer system is necessary, and a packet queue for timing absorption necessary for these methods can be abolished, so that the amount of circuit mounting is smaller and chip manufacture cost is cheap.

Third Embodiment

In this third embodiment, five semiconductor integrated circuits that are housed in a single package and are coupled by the 3D coupling will be explained.

Figure 38:
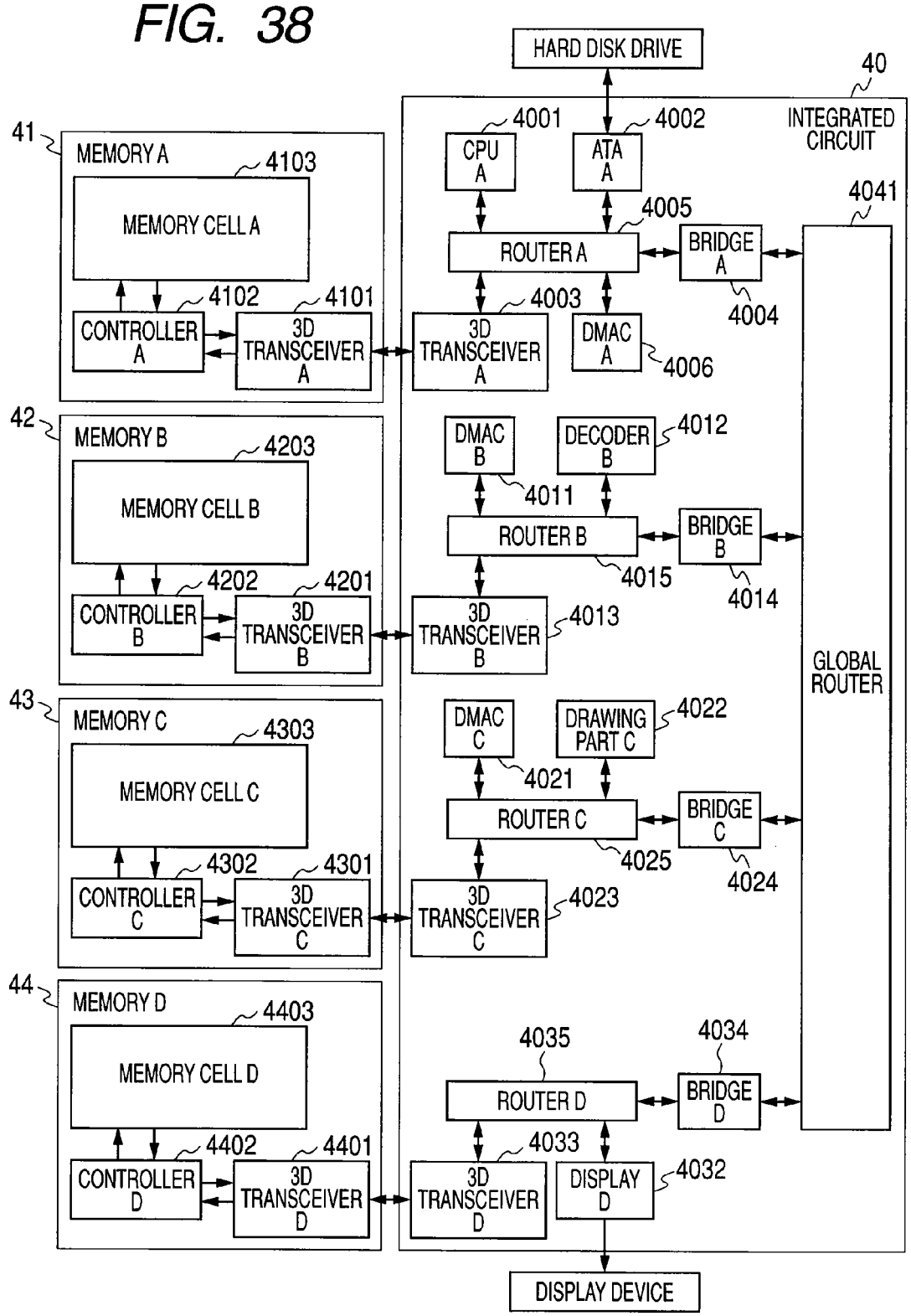
FIG. 38 is a block diagram showing a configuration of a semiconductor integrated circuit and its connection form according to a third embodiment of the present invention.

FIG. 38 is a block diagram showing a configuration of the semiconductor integrated circuits and their connection form in this third embodiment.

This third embodiment aims at increasing memory access capability of a SoC (System on a Chip), and thereby increasing throughput of the SoC by connecting plural pieces of memory to the SoC. In this third embodiment, an integrated circuit 40 has functions of reading compressed image data and a graphics drawing command from a hard disk drive, creating an indication data from the data and the command, and displaying it on the display device.

The integrated circuit 40 is constructed by including a CPU A 4001, an ATA A 4002, a 3D transceiver A 4003, a bridge A 4004, a router A 4005, a DMAC A 4006, a DMAC B 4011, a decoder B 4012, a 3D transceiver B 4013, a bridge B 4014, a router B 4015, a DMAC C 4021, a drawing part C 4022, a 3D transceiver C 4023, a bridge C 4024, a router C 4025, a display D 4032, a 3D transceiver D 4033, a bridge D 4034, a router D 4035, and a global router 4041.

The CPU A 4001 is a processor for controlling the whole of the integrated circuit 40 by accessing the memory A 41 through the router A 4005 and executing a program currently held in the memory. Any access in the integrated circuit 40 is, similarly with an access in the integrated circuit A 10 in the first embodiment, performed by split protocol that starts by a module that needs an access transmitting the request packet including the access request and ends by the module that received the access request transmitting the response packet including the access response to the module that requested the access.

The ATA A 4002 is a controller that controls a hard disk drive, and stores in memory A 41 the data read from the hard disk drive.

The DMAC A 4006 is a DMA controller that is connected to the router A 4005 and performs data copy from the memory A 41 to both memory B 42 and the memory C43.

The 3D transceiver A 4003 is a relay circuit for transmitting and receiving the request packet and the response packet between the router A 4005 and the memory A 41.

The 3D transceiver B 4013 is a relay circuit for transmitting and receiving the request packet and the response packet between the router B 4015 and the memory B 42.

The 3D transceiver C 4023 is a relay circuit for transmitting and receiving the request packet and the response packet between the router C 4025 and the memory C43.

The 3D transceiver D 4033 is a relay circuit for transmitting and receiving the request packet and the response packet between the router D 4035 and the memory D44.

Each of the 3D transceiver A 4003, the 3D transceiver B 4013, the 3D transceiver C 4023, and the 3D transceiver D 4033 includes the serializer 1A 106, the parallelizer 1A 107, the parallelizer 2A 108, the serializer 2A 109, the request transmitter circuit A 110, the response receiver circuit A 111, the request receiver circuit A 112, and the response transmitter circuit A 113.

The bridge A 4004, the bridge B 4014, the bridge C 4024, and the bridge D 4034 are relaying circuits that are connected to the router A 4005, the router B 4015, the router C 4025, and the router D 4035, respectively, and relay the request packet and the response packet between the respective router and the global router 4041.

The DMAC B 4011 is a DMA controller that is connected to the router B 4015 and copies data from the memory B 42 to both memory C 43 and memory D 44.

The decoder B 4012 is an image decoder circuit that generates image data by compressing compressed data stored in the memory B 42 and stores the image data in the memory B 42.

The DMAC C 4021 is a DMA controller that is connected to the router C 4025 and copies data from the memory C 43 to the memory D 44.

The drawing part C 4022 is a graphics accelerator that reads a drawing command stored in the memory C 43, generates a graphics object according to the drawing command, and stores the graphics object in the memory C 43.

The display D 4032 is a display controller that reads display data stored in the memory D 44, and outputs the display data to the display device.

The global router 4041 is a relay circuit that relays the request packet and the response packet among the router A 4005, the router B 4015, the router C 4025, and the router D 4035.

Next, the memory A 41, the memory B 42, the memory C 43, and the memory D 44 will be explained.

The memory A 41, the memory B 42, the memory C 43, and the memory D 44 are memory having the same configuration and the same function.

Each memory has a 3D transceiver, a controller, and a memory cell, receives the request packet from the integrated circuit 40, performs an access according to contents of the request packet, and transmits a result of the access to the integrated circuit 40 as a response packet.

As in FIG. 38, by connecting the 3D transceiver to the each router adjacent thereto and directly connecting memory to the each 3D transceiver, the access latency from the initiator inside the integrated circuit to the each memory can be made small. Moreover, by doing this, the amount of the request packets and the response packets that the global router 4041 relays can be made a minimum, and the circuit that constitutes the global router 4041, the amount of its wiring, power consumption of the global router 4041 can be reduced to minimums.

The advantage of the above-mentioned integrated circuit 40 can be attained more notably by making the modules function in a cooperative manner as follows. Below, operations of the integrated circuit 40 will be explained.

The ATA A 4002 stores the data read from the hard disk drive in the memory A 41, and the CPU A 4001 identifies a type of the stored data. If the stored data is compressed image data, the CPU A 4001 will copy it to the memory B 42 using the DMAC A 4006; if it is a graphics command, the CPU A 4001 will copy it to the memory C 43 using the DMAC A 4006.

Image data that the decoder B 4012 generated is copied to the memory D 44 by the DMAC B 4011 that is connected to the same router B 4015 as the decoder B 4012 is connected to, is read by the display D 4032, and is transmitted to the display device.

The graphics object that the drawing part C 4022 generated is copied to the memory D 44 by the DMAC C 4021 connected to the same router C 4025 as the drawing part C 4022 is connected to, is further read by the display D 4032, and is transferred to the display device.

As explained above, data copy between pieces of memory can be efficiently performed by connecting the DMAC to each router.

In the above-mentioned operation, the ATA A 4002, the decoder B 4012, the drawing part C 4022, and the display D 4032 each access only to nearest memory. Therefore, accesses by the ATA A 4002, the decoder B 4012, the drawing part C 4022, and the display D 4032 do not pass through the global router 4041.

Data that the ATA A 4002, the decoder B 4012, and the drawing part C 4022 generated is read by the DMAC connected to the same router to which these modules are connected, and is copied to memory of the DMA transfer destination. In these operations of memory copying, the packet transfer path of the read access is shorter than the packet transfer path of the write access because the number of the modules to pass though is fewer; therefore, the read access is done at higher speed. Since read access is done at higher speed, it is easy to increase the throughput of DMA transfer. A reason why the throughput of DMA transfer is easy to increase if the read access is done at higher speed is that, although the write access can conceal the access latency by delayed writing, the read access will not be completed unless the read data is sent back by the response packet. In order to increase the throughput of the read access, it is necessary to enlarge an access unit of the read access. However, in order to enlarge the access unit, a circuit for holding a large amount of data, such as a packet queue, is necessary. If it is done, the circuit cost will be increased. That is, the throughput and the cost have a relation of trade-off.

According to the third embodiment explained above, the following effects can be realized.

By directly connecting the 3D coupling circuit to the local router, the access latency of the module can be shortened and access via the global router is made to a minimum. Since access via the global router can be made a minimum, a circuit cost and power consumption of the global router can be made small.

By connecting the DMAC to the local router, it is made easy to increase the throughput of data copy between pieces of memory.

Although connection between the integrated circuit including the CPU etc. and the memory was shown in this third embodiment, there may be a case where a plurality of integrated circuits that are not memory are connected to one another with the same 3D transceiver as of the third embodiment. The integrated circuit to connect may be the same integrated circuit, or may be an integrated circuit different from it. The invention enables a plurality of integrated circuits to communicate with one another with low power consumption, and enables functions that otherwise are integrated in a single integrated circuit to be divided and installed in the plurality of integrated circuits. As an example of this, there is connection of a general-purpose processor and a product-peculiar ASIC, or the like. The invention makes possible increase in the yield and manufacture by different processes each suited to an individual function.

Although the invention made by the present inventors was concretely explained based on its embodiments above, it is natural that the embodiment of the present invention is not restricted to the above-mentioned embodiments, and that it can be modified variously without deviating from the scope and spilt of the present invention.

What is claimed is:

1. A semiconductor integrated circuit, comprising:
an initiator for transmitting an access request;
a target for receiving the access request and transmitting an access response;
a router for relaying the access request and the access response; and
a 3D transceiver including a transmitter circuit and a transmission terminal for performing communication to an outside of the semiconductor integrated circuit, a driver circuit for supplying a change of a potential to the transmission terminal, a receiver circuit including a reception terminal for performing communication from outside of the semiconductor integrated circuit, and a converting circuit for converting a change of a potential in the reception terminal into a reception object signal,
wherein the initiator, the target, and the 3D transceiver are connected with each other via the router, and
wherein the 3D transceiver is disposed adjacent to the router.

2. The semiconductor integrated circuit according to claim 1,
wherein the 3D transceiver is disposed in a central part of the semiconductor integrated circuit.

3. The semiconductor integrated circuit according to claim 1,
wherein the 3D transceiver further includes first and second transmission coil groups and first and second reception coil groups paired in correspondence with the first and second transmission coil groups, respectively, wherein the first and second transmission coil groups are disposed in positions of point symmetry with reference to a central point of the semiconductor integrated circuit, wherein the first and second reception coil groups are disposed in positions of point symmetry with reference to the central point of the semiconductor integrated circuit, wherein the first transmission coil group and the first reception coil group are disposed in positions of line symmetry with reference to a centerline containing the central point of the semiconductor integrated circuit, and wherein the second transmission coil group and the second reception coil group are disposed in positions of line symmetry with reference to the centerline containing the central point of the semiconductor integrated circuit.

4. The semiconductor integrated circuit according to claim 1, wherein communication outside of the semiconductor integrated circuit by the 3D transceiver is performed using a source synchronization method in which a data sender transmits data together with a clock.

5. A semiconductor device, wherein a plurality of semiconductor integrated circuits according to claim 1 are stacked over one another.

6. The semiconductor device according to claim 1, wherein the transmission terminal and the reception terminal each include a coil.

7. A semiconductor integrated circuit, comprising:
an initiator configured to transmit an access request;
a target configured to receive the access request and to transmit an access response;
a router configured to relay the access request and the access response;
a 3D transceiver including a transmitter circuit and a transmission terminal for performing communication to an outside of the semiconductor integrated circuit, a driver circuit for supplying a change of a potential to the transmission terminal, a receiver circuit including a reception terminal for performing communication from outside of the semiconductor integrated circuit, and a converting circuit for converting a change of a potential in the reception terminal into a reception object signal;
a serializer that serializes the access request and the access response received from the router and supplies them to the 3D transceiver; and
a parallelizer that parallelizes the access request and the access response received from the 3D transceiver and supplies them to the router,
wherein the initiator, the target, and the 3D transceiver are connected with each other via the router, and
wherein the serializer and the parallelizer are disposed adjacent to both the router and the 3D transceiver.

8. The semiconductor integrated circuit according to claim 7,
wherein the 3D transceiver is disposed in the central part of the semiconductor integrated circuit.

9. The semiconductor integrated circuit according to claim 7,
wherein the 3D transceiver further includes first and second transmission coil groups and first and second reception coil groups paired in correspondence with the first and second transmission coil groups, respectively,
wherein the first and second transmission coil groups are disposed in positions of point symmetry with reference to a central point of the semiconductor integrated circuit,
wherein the first and second reception coil groups are disposed in positions of point symmetry with reference to the central point of the semiconductor integrated circuit,
wherein the first transmission coil group and the first reception coil group are disposed in positions of line symmetry with reference to a centerline containing the central point of the semiconductor integrated circuit, and
wherein the second transmission coil group and the second reception coil group are disposed in positions of line symmetry with reference to the centerline containing the central point of the semiconductor integrated circuit.

10. The semiconductor integrated circuit according to claim 7,
wherein communication with the outside of the semiconductor integrated circuit by the 3D transceiver is performed using a source synchronization method in which a data sender transmits data together with a clock.

11. A semiconductor device, wherein a plurality of semiconductor integrated circuits according to claim 7 are stacked over one another.

12. A semiconductor integrated circuit, comprising:
an initiator for transmitting an access request;
a target for receiving the access request and transmitting an access response;
a local router for relaying the access request and the access response;
a global router for relaying the access request and the access response that the local router transmits and receives; and
a 3D transceiver including a transmitter circuit and a transmission terminal for performing communication to an outside of the semiconductor integrated circuit, a driver circuit for supplying a change of a potential to the transmission terminal, a receiver circuit including a reception terminal for performing communication from outside of the semiconductor integrated circuit, and a converting circuit for converting a change of a potential in the reception terminal into a reception object signal,
wherein the initiator, the target, and the 3D transceiver are connected with each other via the local router, and
wherein the 3D transceiver is disposed adjacent to the local router.

13. A semiconductor device wherein the semiconductor integrated circuit according to claim 12 and a memory chip are stacked over each other.

14. A semiconductor integrated circuit, comprising:
an initiator for transmitting an access request;
a target for receiving the access request and transmitting an access response;
a local router for relaying the access request and the access response;
a DMA controller for transmitting the access request and performing a memory copying operation;
a global router for relaying the access request and the access response between the local routers; and
a 3D transceiver including a transmitter circuit and a transmission terminal for performing communication to an outside of the semiconductor integrated circuit, a driver circuit for supplying a change of a potential to the transmission terminal, a receiver circuit including a reception terminal for performing communication from outside of the semiconductor integrated circuit, and a converting circuit for converting a change of a potential in the reception terminal into a reception object signal,
wherein the initiator, the target, and the 3D transceiver are connected with each other via the local router, and
wherein the DMA controller and the 3D transceiver are disposed adjacent to the local router.

15. A semiconductor device, wherein the semiconductor integrated circuit according to claim 14 and a memory chip are stacked over each other.

* * * * *